US009624598B2

(12) United States Patent
Wong et al.

(10) Patent No.: US 9,624,598 B2
(45) Date of Patent: Apr. 18, 2017

(54) SEGMENTED METALLIC NANOSTRUCTURES, HOMOGENEOUS METALLIC NANOSTRUCTURES AND METHODS FOR PRODUCING SAME

(71) Applicant: The Research Foundation for The State University of New York, Albany, NY (US)

(72) Inventors: Stanislaus Wong, Stony Brook, NY (US); Christopher Koenigsmann, Mahopac, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 544 days.

(21) Appl. No.: 14/011,864

(22) Filed: Aug. 28, 2013

(65) Prior Publication Data
US 2014/0065437 A1 Mar. 6, 2014

Related U.S. Application Data

(60) Provisional application No. 61/697,543, filed on Sep. 6, 2012.

(51) Int. Cl.
*B22F 9/24* (2006.01)
*B82Y 30/00* (2011.01)
(Continued)

(52) U.S. Cl.
CPC .............. *C30B 7/14* (2013.01); *B22F 1/0025* (2013.01); *B22F 9/24* (2013.01); *B82Y 30/00* (2013.01); *C30B 29/02* (2013.01); *C30B 29/52* (2013.01); *C30B 29/60* (2013.01); *Y10T 428/12493* (2015.01)

(58) Field of Classification Search
None
See application file for complete search history.

(56) References Cited

U.S. PATENT DOCUMENTS 7,575,735 B2    8/2009  Wong et al.
8,304,089 B1 *  11/2012 Song ................... B22F 1/0025
                                                    428/605
(Continued)

OTHER PUBLICATIONS

Patete et al., "Viable methodologies for the synthesis of high-quality nanostructures," The Royal Society of Chemistry, Green Chem., 2011, 13, 482-519.
(Continued)

*Primary Examiner* — George Wyszomierski
(74) *Attorney, Agent, or Firm* — Hoffman & Baron, LLP

(57) ABSTRACT

The present invention includes a method of producing a segmented 1D nanostructure. The method includes providing a vessel containing a template wherein on one side of the template is a first metal reagent solution and on the other side of the template is a reducing agent solution, wherein the template comprises at least one pore; allowing a first segment of a 1D nanostructure to grow within a pore of the template until a desired length is reached; replacing the first metal reagent solution with a second metal reagent solution; allowing a second segment of a 1D nanostructure to grow from the first segment until a desired length is reached, wherein a segmented 1D nanostructure is produced.

10 Claims, 13 Drawing Sheets

(51) Int. Cl.
*C30B 7/14* (2006.01)
*C30B 29/52* (2006.01)
*C30B 29/02* (2006.01)
*C30B 29/60* (2006.01)
*B22F 1/00* (2006.01)

(56) References Cited

U.S. PATENT DOCUMENTS

| | | | |
|---|---|---|---|
| 2010/0025224 A1* | 2/2010 | He | B01J 19/10 204/157.42 |
| 2010/0058978 A1* | 3/2010 | Nikoobakht | B22F 1/0025 117/68 |
| 2010/0278720 A1 | 11/2010 | Wong et al. | |
| 2013/0062279 A1* | 3/2013 | Bhattacharyya | B01D 67/0079 210/501 |
| 2013/0084210 A1 | 4/2013 | Wong et al. | |

OTHER PUBLICATIONS

Koenigsmann et al., "Size-Dependent Enhancement of Electrocatalytic Performance in Relatively Defect-Free, Processed Ultrathin Platinum Nanowires," American Chemical Society, Nano Lett. 2010, 10, 2806-2811.

Zhou et al., "Enhanced Electrocatalytic Performance of One-Dimensional Metal Nanowires and Arrays Generated via an Ambient, Surfactantless Synthesis," J. Phys. Chem C. 2009 113, 5460-5466.

Xiong et al., "Shape-Controlled Synthesis of Metal Nanostructures: The Case of Palladium," Adv. Mater. 2007, 19, 3385-3391.

Huang et al., "One-Pot, High-Yield Synthesis of 5-Fold Twinned Pd Nanowires and Nanorods," J. Am. Chem. Soc. 2009, 131, 4602-4603.

Wang et al., "Pd nanowire arrays as electrocatalysts for ethanol electrooxidation," Electrochem. Commun. 2007, 9, 1212-1216.

Kline et al., "Template-Grown Metal Nanowires," Inorg. Chem. 2006, 45(19) 7555-7565.

Tiano et al., "Solution-Based Synthetic Strategies for One-Dimensional Metal-Containing Nanostructures," Chem. Commun. 2010, 46, 8093-8130.

Koenigsmann et al., "Highly Enhanced Electrocatalytic Oxygen Reduction Performance Observed in Bimetallic Palladium-Based Nanowires Prepared under Ambient, Surfactantless Conditions," American Chemical Society, Nano Lett. 2012, 12, 2013-2020.

Koenigsmann et al., "Ambient Surfactantless Synthesis, Growth Mechanism, and Size-Dependent Electrocatalytic Behavior of High Quality, Single Crystalline Palladium Nanowires," AcsNano 2011, 5(9), 7471-7487.

Koenigsmann et al., "Multifunctional Nanochemistry: Ambient, Electroless, Template-Based Synthesis and Characterization of Segmented Bimetallic Pd/Au and Pd/Pt Nanowires as High-Performance Electrocatalysts and Nanomotors," Isr. J. Chem. 2012, 52, 1090-1103.

* cited by examiner

SEGMENTED METALLIC NANOSTRUCTURES, HOMOGENEOUS METALLIC NANOSTRUCTURES AND METHODS FOR PRODUCING SAME

CROSS-REFERENCE TO RELATED APPLICATION

This application claims the benefit of U.S. Provisional Application No. 61/697,543, filed Sep. 6, 2012, which is incorporated herein by reference in its entirety.

This invention was made with support by the U.S. Department of Energy Office of Basic Energy Sciences under Contract DE-ACO2-98CH10886. The Government has certain rights in this invention.

BACKGROUND OF THE INVENTION

One-dimensional (1D) nanostructures have garnered significant and growing attention in the literature recently, owing to their diverse properties that are uniquely dependent upon not only size but also morphology. The distinctive optical (including plasmonic), electronic and thermal properties observed in 1D nanostructures composed of noble metals has rendered this class of materials as particularly attractive. Segmented nanowires represent a multifunctional platform with a broad range of potential application.

However, a critical technological shortfall in the practical production of these structures continues to be the lack of simple, scalable, efficient and environmentally friendly methods for their production. In the case of segmented nanowires, the most commonly employed method has been template-assisted, sequential electrodeposition. But this protocol is costly and requires complex processes and caustic reaction media.

Accordingly, there remains a need in the art for techniques that would allow segmented one-dimensional nanostructures to be controllably produced in a simple and environmental safe manner.

SUMMARY OF INVENTION

The present invention includes a method of producing segmented 1D nanostructures. The method comprises providing a vessel containing a template wherein on one side of the template is a first metal reagent solution and on the other side of the template is a reducing agent solution, wherein the template comprises at least one pore; allowing a first segment of a 1D nanostructure to grow within a pore of the template until a desired length is reached; replacing the first metal reagent solution with a second metal reagent solution; allowing a second segment of a 1D nanostructure to grow from the first segment until a desired length is reached, wherein a segmented 1D nanostructure is produced. The length of a segment can be increased by increasing the growth time.

Preferably, the 1D nanostructure is a nanowire, a nanotube, or an array comprising a plurality of nanowires.

The metals of the first metal salt solution and the second metal salt solution are different from one another and the metals are selected from the group consisting of transition metals, actinide metal and lanthanide metals. Preferably, the metals are selected from the group consisting of Ru, Rh, Pd, Ag, Os, Ir, Pt and Au.

The reducing agent of the reducing agent solution preferably comprises at least one of metal borohydrides, sodium cyanoborohydride, citric acid, citrate anion, ascorbic acid, ascorbate anion, formic acid, formate anion, oxalic acid, oxalate anion, lithium aluminum hydride, diborane, alpine borane, hydrogen gas, hydrazine, and 2-mercaptoethanol.

Preferably, nucleation of the first segment of the nanostructure occurs at an interface of a pore of the template and the reducing agent solution.

In one embodiment, before allowing the second segment to grow, the concentration of the reducing agent is increased by about two fold to about fifty fold. In this embodiment, the region of alloying is less than about 100 nm. In one embodiment, the method further comprises growing at least one additional segment from the 1D nanostructure to form at least three segments.

In one embodiment of the invention, a segmented 1D metallic nanostructure is provided, formed by a method comprising providing a vessel containing a template wherein on one side of the template is a first metal reagent solution and on the other side of the template is a reducing agent solution, wherein the template comprises at least one pore; allowing a first segment of a 1D nanostructure to grow within a pore of the template until a desired length is reached; replacing the first metal reagent solution with a second metal reagent solution; allowing a second segment of a 1D nanostructure to grow from the first segment until a desired length is reached.

In another embodiment of the invention, a method of producing a homogeneous bimetallic 1D nanostructure with the chemical formula $A_{1-x}B_x$, wherein x is between zero and one, is provided. The method comprises providing a vessel containing a template wherein on one side of the template is a mixed precursor solution and on the other side of the template is a reducing agent solution, wherein the template comprises at least one pore; allowing a 1D nanostructure to grow within a pore of the template until a desired length is reached; wherein the mixed precursor solution comprises a salt of A and a salt of B, wherein A and B are metals selected from the group consisting of transition metals, actinide metal and lanthanide metals.

Preferably, the metal reagent comprises a metal salt comprising a metal cation of the transition metal, actinide metal or the lanthanide metal of the metal reagent, with a corresponding anion including at least one of halides, oxides, acetates, acetyl-acetates, nitrates, phosphates, sulfates, sulfides, citrates, hydroxides, amine halides, amine hydroxides, hydrogen halides, alkali halides, ethylenediamine halides, hydrogen hydroxides, cyanides and carbonates.

In one embodiment, the salt of A has the chemical formula $H_xACl_y$ and the salt of B has the chemical formula $H_xBCl_y$.

In another embodiment of the invention, a homogeneous bimetallic 1D nanostructure with the chemical formula $A_{1-x}B_x$, wherein x is between zero and one, is provided. The nanostructure is formed by the method comprising: providing a vessel containing a template wherein on one side of the template is a mixed precursor solution and on the other side of the template is a reducing agent solution, wherein the template comprises at least one pore; allowing a 1D nanostructure to grow within a pore of the template until a desired length is reached; wherein the mixed precursor solution comprises a salt of A and a salt of B, wherein A and B are metals selected from the group consisting of transition metals, actinide metal and lanthanide metals.

The present invention overcomes shortcomings in the prior art. The present invention provides an ambient, surfactantless, template-based method for the reliable production of segmented 1D nanostructures that is not only sustainable but also efficient. The methods allow for direct and predictable control over the relative segment lengths in these nanomaterials. Moreover, the segmented nanostructures of the present invention maintain high quality, crystalline, elementally pure sub-units with a well-defined interface between the constituent metals. These 1D nanostructures achieve high levels of performance when employed as both electrocatalysts and nanomotors.

DETAILED DESCRIPTION OF THE INVENTION

Figure 1:
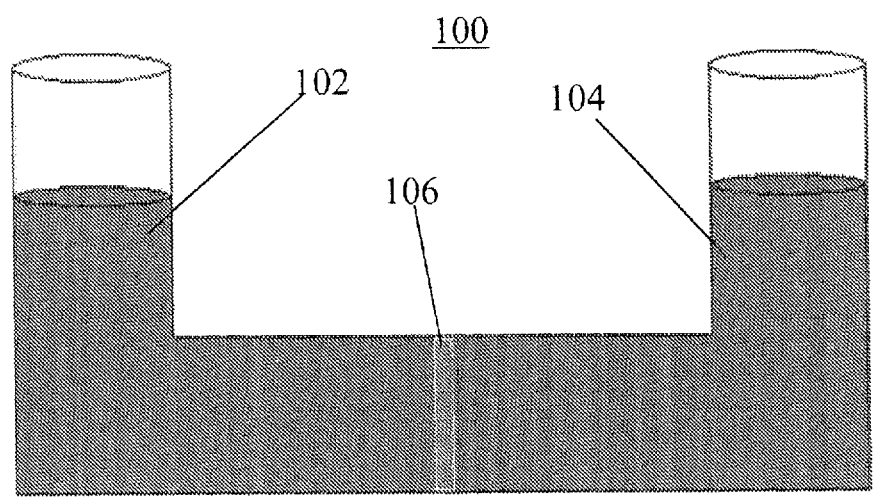
FIG. 1 illustrates a U-tube double diffusion vessel that is employed in an embodiment of the invention to synthesize the nanostructures of the present invention.

The following detailed description of certain embodiments of the present invention will be made in reference to the accompanying drawings. In describing the invention, explanation about related functions or constructions known in the art are omitted for the sake of clearness in understanding the concept of the invention, to avoid obscuring the invention with unnecessary detail.

The present invention provides one-dimensional (1D) metal nanostructures, including segmented metallic 1D nanostructures and homogeneous bimetallic 1D nanostructures. One-dimensional nanostructures include nanowires, nanotubes, nanorods, nanobelts, and nanocylinders. Nanotubes are hollow with varying wall thicknesses. Nanowires and nanorods are solid. Nanowires and nanorods differ in aspect ratios (i.e., diameter/length). An aspect ratio of greater than 5 is known as a nanowire. Nanorods typically have an aspect ratio of about 3 to about 5.

The nanostructures of the present invention include freestanding 1D nanostructures and include nanoarrays comprising a plurality of such 1D nanostructures. Preferably, a nanoarray is at least 50%, 60%, 70%, 80%, 90%, 95%, 99% or virtually completely monodisperse.

The invention also includes methods of making such nanostructures.

One-Dimensional Nanostructures

Purity of Nanostructures

The 1D nanostructures of the present invention are substantially free of organic contaminants (e.g., capping agents, surface ligands or surfactants) and impurities (e.g., non-metallic impurities, such oxides, halides, sulfides, phosphides, or nitrides) without employing additional purification steps.

Additionally, the nanostructures are free of organic surfactant molecular groups (including nonionic surfactants, cationic surfactants, and anionic surfactants), such as bis(2-ethylhexyl)sulphosuccinate, undecylic acid, sodium dodecyl sulfate (SDS), Triton X-100, decylamine, or double-hydrophilic block copolymers, which are present on the surfaces of prior art nanostructures.

The nanostructures of the invention are crystalline and solid. Preferably, the nanostructures are at least 95%, more preferably at least 99%, and most preferably virtually completely free of defects and/or dislocations. As defined in this specification, defects are irregularities in the crystal lattice. Some examples of defects include a non-alignment of crystallites, an orientational disorder (e.g., of molecules or ions), vacant sites with the migrated atom at the surface (Schottky defect), vacant sites with an interstitial atom (Frenkel defects), and non-stoichiometry of the crystal. An example of a dislocation is a line defect in a crystal lattice.

Segmented 1D Metallic Nanostructures

In one embodiment, the invention provides segmented 1D metallic nanostructures. Segmented 1D nanostructures are made up of two or more discrete segments (i.e., sub-units) fused together and oriented along the long axis of the 1D nanostructure. Each segment is composed of an elemental metal which is different from the elemental metal of its adjoining fused segment. Typically, the 1D nanostructure is at least 95% single crystalline, more typically, 99% single crystalline, and most typically, virtually completely single crystalline.

The metals suitable for the segmented 1D nanostructures include transition metals, actinide metals and lanthanide metals. In a preferred embodiment, the metals are selected from Ru, Rh, Pd, Ag, Os, Ir, Pt and Au. For example, a segmented 1D nanostructure can comprise the following segments: Pd—Au—Pd or Pd—Au or Pt—Pd—Au.

The region where adjoining elemental metals meet in the 1D nanostructure is termed the interface. The interface typically has a "region of alloying." The "region of alloying" is a region where the adjoining metals are both present as a mixture in the 1D nanostructure. In one embodiment, the "region of alloying" is substantial, for example, over 100 nm in length. In another embodiment, the "region of alloying" is insignificant. That is, the interface is sharp and well-defined. In such embodiment, the "region of alloying" is, for example, less than about 75 to 100 nm in length, more preferably, less than 50 to 75 nm is length, most preferably less than 25 nm to 50 nm. In one embodiment, the region of alloying is virtually undetectable.

Quantification of the "region of alloying" can also be represented as a percentage of the length of the 1D nanostructure. For example, when the interface is considered sharp and well-defined, the region can be less than about 5%, more preferably, less than about 2%, of the full length of a about 6 to 8 μm 1D nanostructure.

Homogeneous Bimetallic 1D Nanostructures

In one embodiment, the invention provides homogeneous bimetallic 1D nanostructures. These 1D nanostructures are homogeneous alloys of two different metals. The chemical formula for these alloys is $A_{1-x}B_x$, wherein x is any number between zero and one. That is, x is the fraction of metal B within the alloy. For example, when x=0.25, the alloy consists of 25% B and 75% A.

The metals suitable for the segmented 1D nanostructures include transition metals, actinide metals and lanthanide metals. Examples of homogeneous bimetallic 1D nanostructures include $Pd_{1-x}Au_x$; $Pd_{1-x}Pt_x$; $Pt_{1-x}Au_x$ and $Ag_{1-x}Pt_x$, wherein x is, for example, 0.1, 0.25, 0.5, 0.75 and 0.9.

Methods of Making the Nanostructures

One embodiment of the present invention is a method of making the nanostructures of the present invention.

The methods avoid use of (and preferably do not use) surfactants, electrochemical equipment, toxic reaction media, and physical and chemical vapor deposition techniques. Toxic reaction media include, for example, the strong acids or bases used during the electrodeposition process (e.g., 0.1-1 M sulfuric acid (pH=1-0) is used as the electrolyte for the deposition of metals to form segmented nanowires by electrochemical deposition). Chemical vapor deposition uses highly toxic metal precursors to generate segmented nanostructures and requires very high temperatures 400-800° C. In contrast, the methods of the present invention utilize environmentally friendly solvents, such as alcohols or water, and are performed under ambient conditions.

The methods enable the making of nanostructures with predictable size and morphology. The methods comprise the use of templates which comprise at least one pore.

In the methods, selected metal reagent solutions (i.e., metal precursor solutions) are placed in contact with reducing agent solutions in a manner which allows for a slow rate of contact. Typically, a metal reagent solution and a reducing agent solution are placed into two reservoirs separated from each other by a template, i.e., placed into a vessel containing a template which separates the two solutions.

An example of a set-up that is suitable for the present method is a double-diffusion set-up 100. See FIG. 1. In this set-up, synthesis of a 1D nanostructure is achieved by addition of a first solution 102 including a metal reagent, and a reducing agent solution 104 into first and second half-cells, respectively, of a U-tube double diffusion vessel 100.

The reducing agent can be any suitable reducing agent. Preferably, the reducing agent includes at least one of metal borohydrides, sodium cyanoborohydride, metals (Na, Li, K, Rb, Cs, Mg, Ca, Al, Zn etc.), citric acid, citrate anion, ascorbic acid, ascorbate anion, formic acid, formate anion, oxalic acid, oxalate anion, lithium aluminum hydride, diborane, alpine borane, hydrogen gas, hydrazine, and 2-mercaptoethanol.

The metal reagent solutions and the reducing agent solutions are provided in a solvent including at least one of water and an alcohol, and mixtures thereof. The nanostructures are synthesized with the solvent in a liquid state. Specifically, the temperature of the solutions is above the melting point and below the boiling point of the solvent, and preferably at ambient conditions. However, heating of the solutions during the nanostructure synthesis provides a more rapid formation of the nanostructures and promotes formation of polycrystalline nanostructures. Additionally, cooling the first and second solutions during the nanostructure synthesis slows the growth of the nanostructure and promotes formation of single crystalline nanostructures. Reactions can be run at any temperature that is between the melting and boiling points of the solvents. Preferably, the reaction is run at room temperature. High concentrations of the reducing agent solution tend to promote formation of polycrystalline nanostructures, while low concentrations of the reducing agent solution tend to promote the formation of single crystalline nanostructures.

The 1D nanostructure synthesis proceeds for a selected amount of time, preferably between 1 second and 24 hours, and may proceed longer than 24 hours to fill the pore(s) of a template. After completion of the reaction, the template is removed from the vessel with the synthesized 1D nanostructures contained therein. The nanostructures can be isolated as either a solid powder or as free-standing nanowire arrays, as would be known to a skilled artisan.

Segmented 1D Nanostructures

In one embodiment, methods of making segmented 1D nanostructures are provided. In this method, different metal reagent solutions (i.e., metal precursor solutions) are sequentially placed on one side of a template with a reducing agent solution on the other side of the template.

Each metal reagent solution of a sequence comprises the salt of a single elemental metal selected from transition metals, actinide metals and lanthanide metals. The metal salt preferably includes a metal cation with a corresponding anion including at least one of halides, oxides, acetates, acetyl-acetates, nitrates, phosphates, sulfates, sulfides, citrates, hydroxides, amine halides, amine hydroxides, hydrogen halides, alkali halides, ethylenediamine halides, hydrogen hydroxides, cyanides and carbonates.

More particularly, in the method, a first metal reagent solution is placed on one side of a template, and on the other side of the template is a reducing agent solution. A first segment (i.e., base segment) of a 1D nanostructure is allowed to grow within a pore of the template until a desired length is reached. Then the first metal reagent solution is replaced with a second metal reagent solution. A second segment of a 1D nanostructure is allowed to grow from the first segment until a desired length is reached. If more segments of the 1D nano structure are desired, additional metal reagent solutions can be used in sequence. The addition of further segments is limited by the length of the pore(s) of the template.

Relative lengths of metal segments in nanostructures can be controlled by simply halting the growth reaction when a desired length of a particular metal is reached, and beginning growth again with a different metal reagent solution.

In one embodiment, the "region of alloying" between two segments is minimized. That is, the elemental purity of each segment is maximized. In this embodiment, an additional step is taken before, or when, replacing a selected metal reagent solution with a subsequent metal reagent solution. In particular, the concentration of the reducing agent solution is increased by about two fold to about fifty fold, more typically, from about five fold to about ten fold, before, or when, the subsequent metal reagent solution is added.

The "region of alloying" can further be minimized by a further step. Between the growth of two segments, a washing step is employed. By this washing step, any residual metal precursor is removed from the vessel and extracted from the template pore(s). The washing is performed with any solvent that does not dissolve or etch the template, is capable of solubilizing the metal salt, and preferably, environmentally benign. Thus, the solvent depends upon the template itself, as would be known to a skilled artisan. For example, for a polycarbonate template, suitable solvents include alcohols (e.g., ethanol, methanol propanol, butanol, and derivatives of these such as isopropanol isobutanol or polyols), water, and dilute mineral acids.

For example, the synthesis of noble metal nanowires (NWs) can be accomplished by utilizing a U-tube double diffusion device, consisting of two glass-half cells mutually separated by a polycarbonate (PC) template. In this synthetic scheme, a precursor solution, composed of the appropriate soluble metal salt (e.g. $H_2PtCl_6$ or $Na_2PdCl_6$ in the case of Pt or Pd) and a reducing agent solution (e.g. dissolved sodium borohydride ($NaBH_4$)), are separately loaded into the two glass half cells.

Homogeneous Bimetallic 1D Nanostructures

One embodiment of the present invention is a method of making homogeneous bimetallic 1D nanostructures. In the methods, the metal reagent solutions are mixed precursor solutions. A mixed precursor solution comprises salts of two different metals; the metals selected from transition metals, actinide metals and lanthanide metals.

In the method, a selected mixed precursor solution is placed on one side of the template, and on the other side of the template is a reducing agent solution. The 1D nanostructure is allowed to grow within a pore of the template until a desired length is reached. In one embodiment, segmented homogeneous bimetallic 1D nanostructures are provided. In such embodiment, the first mixed precursor solution is replaced with a mixed precursor solution which has metal constituents different from the first mixed precursor solution. Further segments can be added, as desired, limited by the length of the pore(s) of the template.

The concentrations of the mixed precursor achieve a high stoichiometric correlation between the precursor solution composition and the composition of the nanostructures. For example, to achieve the desired nanowire composition ($A_{1-x}B_x$), a mixed precursor solution of identical chemical composition was produced by combining aliquots of the A metal stock solution and the B metal stock solution, respectively, in the appropriate stoichiometric volume fraction so as to generate the total known volume. For example, a combined 5 mL precursor solution containing 3.75 mL of A metal solution and 1.25 mL of B metal solution can be employed in the synthesis of $A_3B$ nanostructures.

In some embodiments of the present invention, a segmented 1D nanostructure is provided which comprises segments which contain only one elemental metal and segments which contain homogenous bimetallic alloyed segments.

Templates

Examples of membranes suitable for the present invention include porous alumina or silica membranes; "track-etch" polymeric membranes; copolymer templates; and TEFLON® membranes.

Alumina membranes have dimensions of the pores which are tunable in the range of 4 to several hundred nanometers. Pore densities as high as $10^{11}$ pores/cm² can be obtained, and typical membrane thickness can range from 10 to 100 µm. Preferred membranes are porous anodic alumina (AAO) membranes. The AAO membranes have a porosity of 40 to 65%.

Silicon membranes are obtained by electrochemical etching of silicon wafers. The resulting porous structures have a thin nanoporous layer (with pore diameters of as small as 3 nm) on top of macroporous layer.

Track-etch membranes contain randomly distributed nanochannels (i.e., pores) of uniform diameter (as small as 10 nm). Pore densities approach $10^9$ pores/cm². These commercially available membranes are usually prepared from polycarbonate or polyester.

In some embodiments, a single carbon nanotube, or an array of carbon nanotubes can be used as the template pore(s). Such carbon nanotubes can be produced by chemical vapor deposition.

Methods of Controlling the Dimensions and Morphology of Nanostructures

The pore(s) of a template allow for control over properties of a 1D nanostructure. The pores effectively serve as spatially confined "reaction chambers," directing the nucleation, i.e. initial formation, and growth of the metal into the desired NW morphology.

The pore diameters of the membranes are varied according to the desired diameters of the resultant nanostructures. For example, the diameters of the pores can range from about 1 nm to about 100 µm, preferably from about 3 nm to about 2 µm, more preferably from about 10 nm to several hundred nanometers. A resultant 1D nanostructure typically has approximately the same diameter as the size of the pore within which it was grown. For example, using a membrane with 200 nm pores produces 1D nanostructure having diameters in the range of 190 to 210 nm. Typically, the diameter is uniform throughout the length of a 1D nanostructure.

The length of 1D nanostructures is controlled by the reaction time and thickness of template pores. That is, growth of a nanostructure continues as the reaction continues. However, the maximum length of the nanostructure is limited by a length of the pore(s). Membranes typically range from approximately about 20 nm to about 100 µm, more typically from about one to about five µm, in thickness.

The width of an array corresponds with the width of the membrane on which the array was grown. The length of an array corresponds with the thickness of the membrane. The 1D nanostructures of an array can be monodisperse by using a membrane with homogeneous pore diameters. Alternatively, the 1D nanostructures of an array can be polydisperse by using a membrane with a variety of different pore sizes.

Additionally, the distances between each individual 1D nanostructure within an array is controlled by varying the pore densities on the membranes. All other parameters being equal, the more dense the porosity of a membrane, the closer each individual 1D nanostructure is to each other. Alternatively, the pores on the membrane can be placed in such a fashion that they are not at a uniform distance from each other.

Although within a nanoarray the 1D nanostructures are individually separated from each other, they form a dense, continuous network. Preferably, the 1D nanostructures are roughly parallel to each other and vertically oriented on the substrates to form a packed array, stretching over micron-sized areas.

The shapes of the 1D nanostructures reflect the morphology and inner surface roughness of the pores within which they were grown. That is, the morphology of the 1D nanostructures can spatially map out the interior nanoscopic profile and localized contours of the internal pores of the membranes.

For example, if the inner surface of a pore within which a 1D nanostructure was grown is smooth, then the resultant 1D nanostructure is straight and smooth. Alternatively, if the inner surface of a pore is rough, then the resultant 1D nanostructure has protrusions or depressions on its surface.

Additionally, preferential formation of nanotubes vis-à-vis nanowires can be achieved by varying the chemical interaction between the precursor and the pore wall. See Koenigsmann et al., *J. Phys. Chem. C* 2009, 113, 5460-5466. In particular, nanotubes are preferentially formed by selecting precursors with strong interactions with the pore wall. This will result in heterogeneous nucleation and growth at the pore wall as opposed to at the pore-reservoir interface. For example, the metal salt $H_2PtCl_6$ (as opposed to other Pt salts) encourages heterogeneous nucleation. Alternatively, the precursor or pore chemistry can be varied to have weak interactions leading to the formation of nanowires. That is, weak interactions between the solubilized metal salt and the pore wall lead to homogeneous nucleation and the formation of wires.

Anisotropic Growth of 1D Nanostructures

In the present invention, nucleation and crystalline growth is controlled. That is, 1D nanostructure growth occurs preferentially and anisotropically in a uni-directional fashion, from one side of the template to the other, in an analogous manner to what is possible with electrodeposition.

Without wanting to be limited by any particular mechanism of action, a theory of the mechanism of the growth follows. Taking into consideration the solution concentrations and pore(s) diameter, the diffusion rate of the precursor solution is suitably increased with respect to that of the reducing agent solution so as to cause the diffusion fronts to intersect at the actual interface between the template pore and the reducing agent half-cell, as opposed to within the interior of the template pore membrane itself. See Koenigsmanns et al., *ACS Nano* 5:7471-7487 (2011), incorporated herein by reference. At this point, a metal regent is nucleated, thereby resulting in the spontaneous formation of a short polycrystalline segment at the pore opening and a thin metallic layer on the external surface of the template. This initial metallic layer, rapidly formed in the first step, is believed to serve as a conductive layer through which electrons are transferred via an electroless deposition process towards the metal precursor solution in the interior of the template. This results in the uni-directional growth of a single crystalline 1D nanostructure segment within the template, which selectively extends and elongates toward the metal precursor half-cell with increasing reaction time. In contrast with electrodeposition, uni-directional growth is achieved under double diffusion conditions without the need for electrochemical equipment, PVD, or caustic reaction media. Furthermore, the uni-directional growth allows for the control of the length of the 1D nanostructure, since the reaction can be halted at any point. Also, different metal precursor solutions can be substituted and introduced for subsequent reduction, thereby allowing for control of the proportion that each segment contributes to the full length nanostructure.

Figure 2:
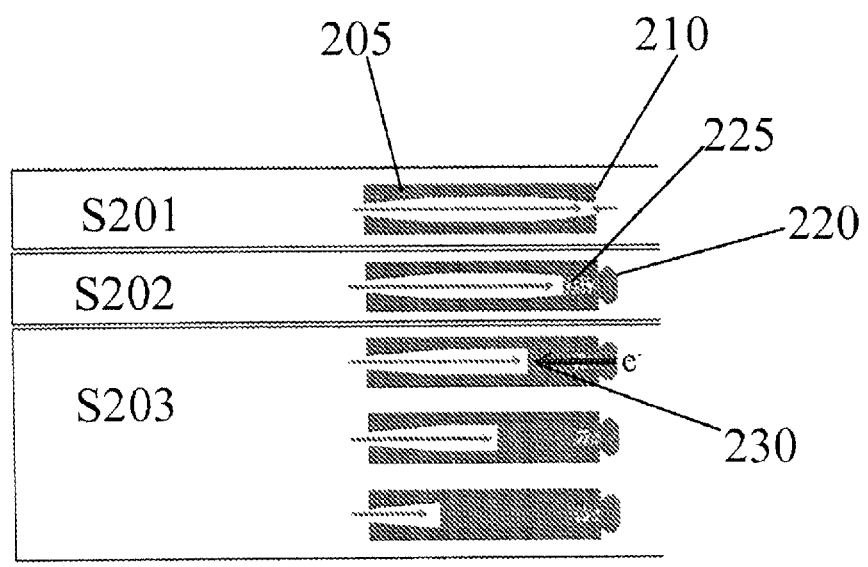
FIG. 2 is a schematic illustration of the growth of a one dimensional nanostructure in a pore of a template.

FIG. 2 is a schematic illustration of a nanowire growth within a single pore of a template. In step S201, the first metal reagent solution and the reducing agent solution diffuse into pore 205 of the template 106, with such diffusion illustrated by the opposing arrows. In step S202, the metal reagent is reduced by the reducing agent and nucleation of a nanowire begins. Nucleation of the nanowire occurs at an interface of the pores and the reducing agent solution on an external surface 210 of the template. Nucleation begins with formation of a metallic surface 220 on the external surface 210 of the pore and followed by a polycrystalline segment 225 of the nanowire within the pore 205. Formation of the metallic surface 220 on the external surface 210 of the pore is observed visually within a minute of addition of the first metal reagent solution and the reducing agent solutions to the U-tube vessel. The formation of the polycrystalline segment 225 in step S202 ends when the polycrystalline segment 225 and the metallic surface 220 create a barrier between the reducing agent solution and the pore 205 and prevent diffusion of the second solution into the pore.

In step S203, a single crystalline segment 230 of the nanowire forms on, and grows from, the polycrystalline segment 225 of the nanowire within the pore 205 of the template through an electroless deposition process. Specifically, electrons (e) transfer through the metallic surface 220 and the polycrystalline segment 225, reducing the metal reagent inside of the pore 205. As observed, transferred electrons, and not direct interaction with the reducing agent, reduce the metal reagent to form the single crystalline segment 230 of the nanowire, whereas the polycrystalline segment 225 is believed to form as a result of direct interaction with, and reduction by, the reducing agent. Formation of the single crystalline segment of the nanowire extends into the pore 205 of the template towards the first metal reagent solution. A second metal reagent solution is added to form a second segment of the nanowire. Completion of the reaction in step S203 is visually observed by formation of a metallic layer on the surface of the template exposed to the second metal reagent solution, which confirms that the nanowires have filled the pore 205.

EXAMPLES

Segmented Nanostructures

Figure 3:
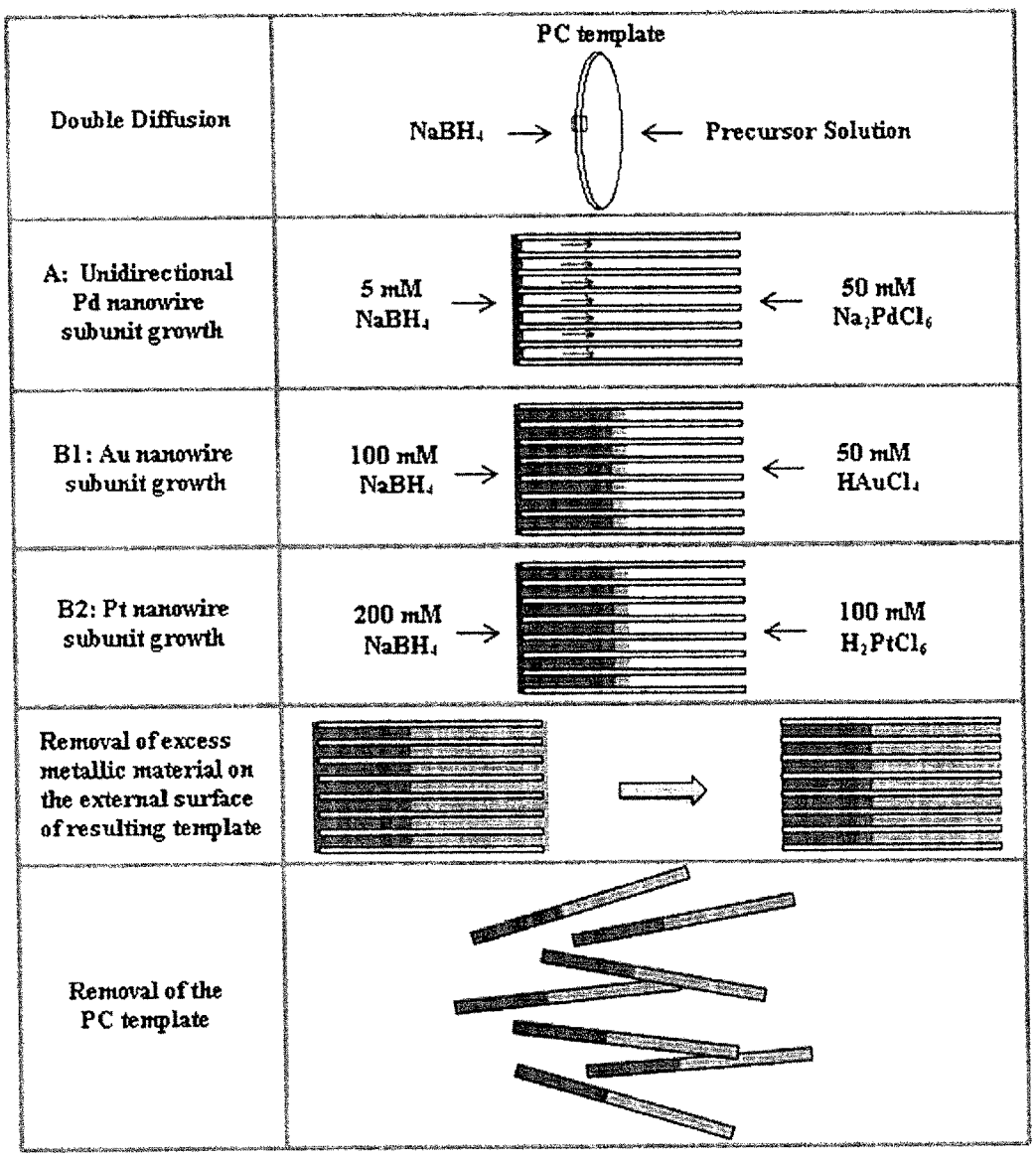
FIG. 3. A schematic representation of the growth of segmented Pd/M (M=Pt or Au) NWs under double diffusion conditions within a representative array of template pores.
Figure 4:
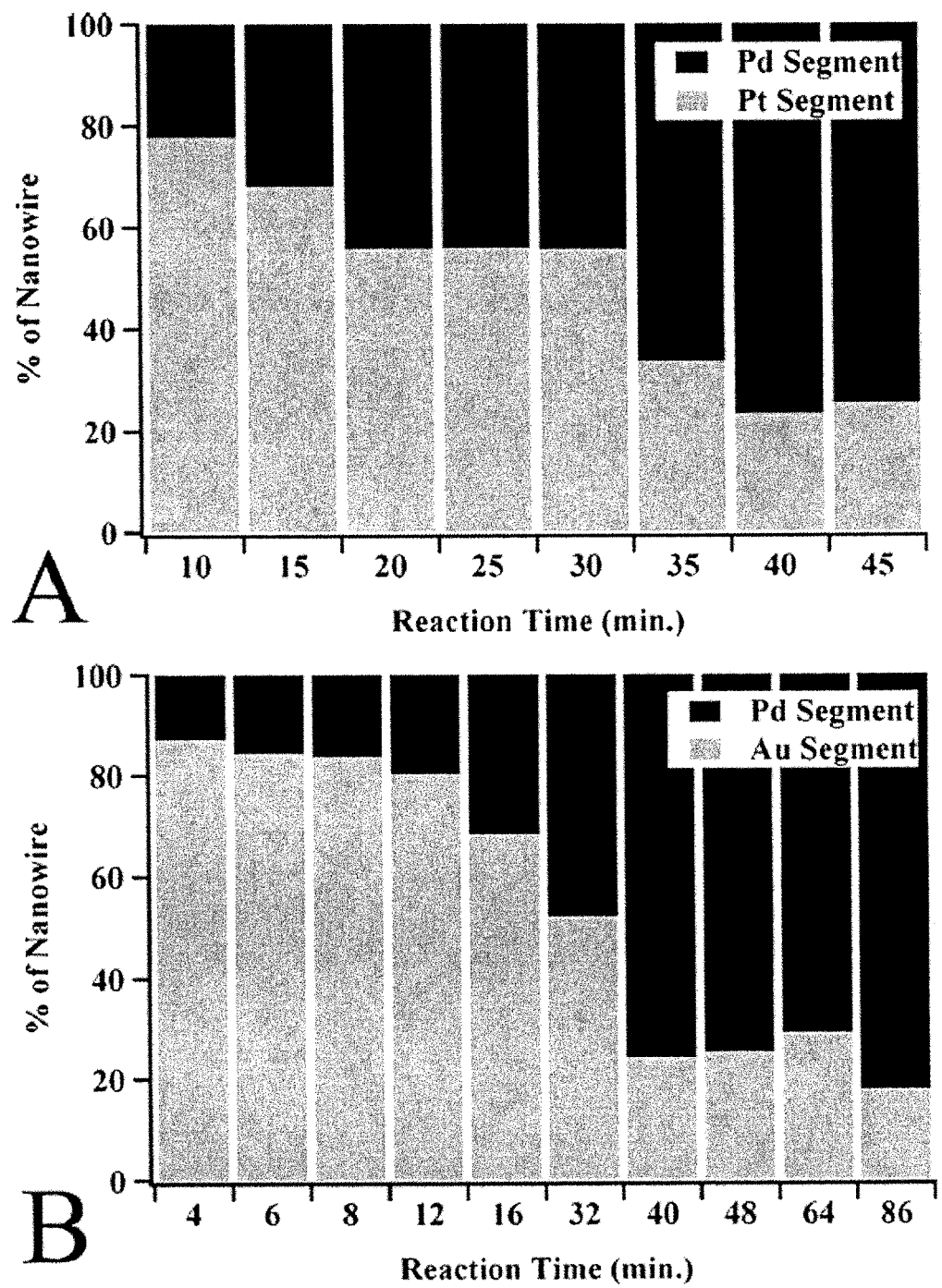
FIG. 4. The relative lengths of the NW segments shown as a percentage of the NW segment with respect to the overall total length of the NW as a function of the reaction time, utilized in the first reaction step for the generation of Pd/Pt NWs (A) and Pd/Au NWs (B).

A detailed synthetic scheme of the two-step protocol in a series of representative template pore cross-sections is shown in FIG. 3. In the first step, a high quality single-crystalline Pd NW "base" segment is grown into the template pore. The initiation of the reaction is signaled by visual corroboration of the formation of metallic material on the surface of the template directly exposed to the reducing agent half-cell. Subsequently, the single crystalline Pd NW segment elongates toward the precursor half-cell as the reaction is allowed to continue. Once the Pd NW of a desired length is grown, the electroless deposition process is suitably quenched by removing the palladium precursor and reducing agent solutions from the pores. The second segment consisting of either Au or Pt is then grown directly from the existing Pd NW segment by a second electroless deposition process, utilizing the appropriate precursor solution (e.g. either $HAuCl_4$ or $H_2PtCl_6$ depending on the desired result). The growth of this secondary segment is initiated at the surface of the existing metallic Pd NW, which serves as a conduit for the relatively efficient transport of electrons from the reducing agent half-cell to the interior of the pore space. The secondary segment, i.e. either Au or Pt, then elongates during this electroless deposition step, until crystalline growth extends beyond the template pore length, thereby resulting in the formation of metallic material on the template surface exposed to the precursor half-cell. Thus, this important visual cue provides key confirmation that the reaction has completed, with all of the template pores saturated with the desired Pd/M ("M"=Au or Pt) NWs.

The relative lengths of the NW segments can be reliably and easily tuned by manipulating the reaction time for the growth of the Pd NW segment in the first electroless deposition step. Specifically, longer reaction times allow for increased crystalline growth and correspondingly longer Pd NW lengths within the template pore. Examination of the Pd segment length in Pd/Au NWs by scanning electron microscopy (SEM) confirms that the length of the Pd segment grown in the first step systematically increases from 0.94±0.14 tm to 6.68±0.76 gm, as the reaction time is increased from 0 to 48 min (Figure S1). Not only is this trend in excellent agreement with that observed from the analogous Pd/Pt NWs but also these results are collectively consistent with prior data obtained from elemental Pd NWs. Since the pore channels of the commercially available PC templates that used in the experiments maintain a nominal length of 6-8 µm, the ability to reproducibly and systematically tune the Pd NW length allows for direct control over the respective lengths of the individual segments, since the secondary segment consisting of either Pt or Au will necessarily occupy the remaining length of the template pore left unreacted by Pd.

Longer initial reaction times led to increased Pd NW lengths, leaving a proportionally smaller fraction of the full pore channel in which either the Au or Pt segment could grow. SEM images obtained from as-prepared Pd/M ("M"=Pt or Au) NWs confirm that the trend in the relative length of the Pd and M segment (FIG. 2) is highly dependent upon the reaction time employed in the first electroless reduction step. Specifically, the relative length of the Pd segment increased from 22.1% to 74.6% of the total NW length, as the initial reaction time was correspondingly raised from 10 to 45 min, for example. Thus, these results collectively substantiate the premise that high quality, crystalline bimetallic NWs can be prepared with a broad range of segment lengths under completely ambient conditions without the need for either electrodeposition or PVD.

Physicochemical Characterization of as-Prepared Segmented Pd/Pt and Pd/Au NWs

Figure 8:
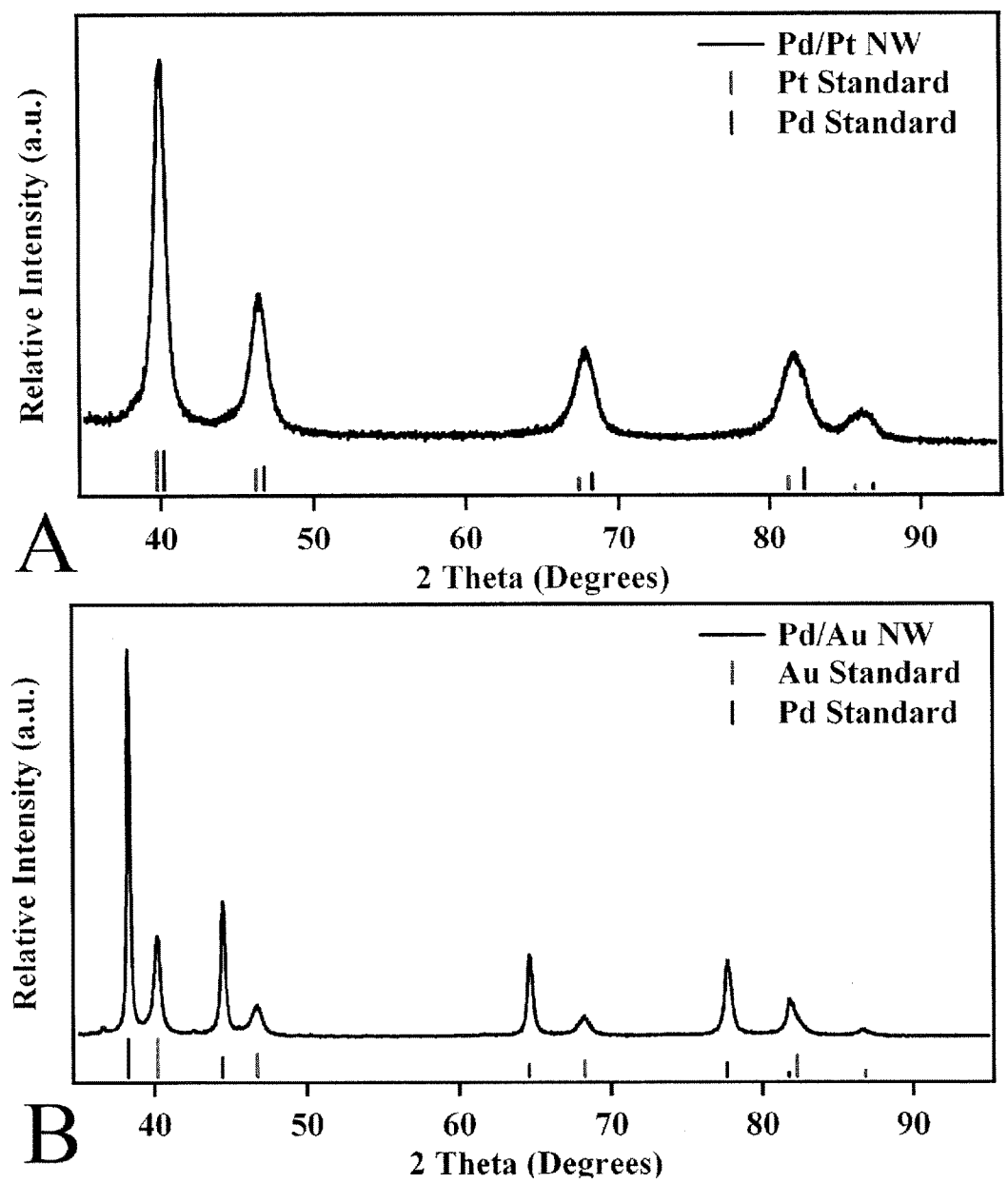
FIG. 8. X-ray powder diffraction patterns obtained from Pd/Pt (A) and Pd/Au (B) segmented nanowires with relative segment lengths of 1/1. The JCPDS standards for pure Pd, Pt, and Au are shown immediately below each pattern (card numbers 46-1043, 04-0802, and 04-0784, respectively.)

To confirm the purity and crystallinity of the as-prepared Pd/Pt and Pd/Au NWs, X-ray powder diffraction (XRD) was performed on Pd/Au and Pd/Pt NWs (FIG. 8) with relative lengths of 1/1. The diffraction pattern obtained from the Pd/Au NWs displays peaks, which can be readily indexed to the (111), (200), (220), and (311) planes of pure face-centered cubic (FCC) Pd and Au phases. Additionally, it is also apparent that no additional peaks are present that could potentially be indexed either to an impurity or to the $Pd_{1-x}Au_x$ alloy-type phase, which might exist at the interface. These results collectively confirm that the individual NWs are composed of pure, crystalline Pd and Au sub-units without any detectable alloying.

By contrast with the results obtained from the Pd/Au alloy, the experimentally determined diffraction pattern from the Pd/Pt NWs highlights the presence of a single set of broadened FCC peaks. However, this result is not surprising, since Pd (3.89 Å) and Pt (3.92 Å) maintain nearly identical lattice parameters resulting in a difference of only 0.35° between the calculated position of the (111) peak for these metals. Therefore, the single set of broadened peaks can be readily attributed to the superposition of the elemental Pd and Pt diffraction peaks with the widened features apparently arising from the nanoscale size of the crystalline grains. Although the XRD data are not sufficient to rule out the presence of alloy-type $Pd_{1-x}Pt_x$ phases as a result of this superposition issue, the lack of any extraneous peaks is consistent with the idea that no other impurity phases are present. Thus, these results collectively suggest that the segmented NWs are composed of discrete elemental Pd, Pt, and Au segments, reasonably free from crystalline impurities.

Subsequently, SEM was employed to examine the morphology of as-prepared Pd/Pt and Pd/Au NWs as a function of the different segment lengths. Specifically, SEM images obtained from collections of Pd/Pt and Pd/Au NWs with relative lengths of 1/3, 1/1, and 3/1 confirm that the as-prepared NWs maintain homogeneous anisotropic 1D structures. The NWs collectively possess diameters of 260±30 nm, confirming that the NW dimensions are highly uniform over a broad range of segment lengths. In addition, the stark and sharp contrast between the Pd segment (low contrast) and either the Pt or Au segments (high contrast) in the SEM images highlights not only the segmented nature of the NWs but also confirms that the synthetic approach can lead to a well-defined, differentiable transition between the sub-units without a significant degree of alloying noticeable at the interface. It is also apparent from the images that the relative segment lengths have been predictably controlled by rationally manipulating the reaction time.

To complement examination of the morphology by SEM, transmission electron microscopy (TEM) and selected area electron diffraction (SAED) was employed to examine both the crystallinity and structure of the individual Pd/Pt and Pd/Au NWs. TEM images collected from individual isolated Pd/Pt and Pd/Au NWs are in excellent agreement with the SEM data, and further confirm that the as-prepared NWs possess a clear, well-defined interface between the segments. Diffraction patterns obtained from the central region of the Pd segment in particular reveal that this segment is highly textured and nearly single crystalline.

By contrast, diffraction patterns obtained from the Au and Pt segments reveal that a polycrystalline texture predominates in these particular segments. This results because a higher concentration of reducing agent (100 mM) was employed in the synthesis of these segments as compared with the solution used in the growth of the Pd NW segment (5 mM). Higher concentrations of reducing agents have been demonstrated to promote faster rates of nucleation as opposed to crystalline growth, thereby leading to a predominance of polycrystallinity.

In one embodiment of the present invention, a higher concentration of reducing agent was used in the second growth step so as to prevent deleterious side reactions between the Au/Pt precursors and the existing Pd NW, and to tune the crystallinity of the Au and Pt segments through rational manipulation of the reducing agent concentration.

A parameter in evaluating the quality of the NWs is to rationally investigate the compositional interface between the Pd and the Pt or Au sub-units in individual NWs. In one embodiment of the present invention, steps were taken in the reaction scheme so as to ensure the generation of segmented NWs with a sharp, well-defined interface between the two distinctive sub-units and to maximize the corresponding elemental purity of the respective sub-units. First, a washing step is performed between the growth of the Pd NW segment and the subsequent Pt or Au segment in order to remove residual Pd precursor from the template. Second, the concentration of reducing agent was increased during the growth of the Pt and Au segments in order to suppress the galvanic displacement of the Pd NW by the Pt and Au precursors, and to thereby prevent alloy formation at the interface.

Figure 5:
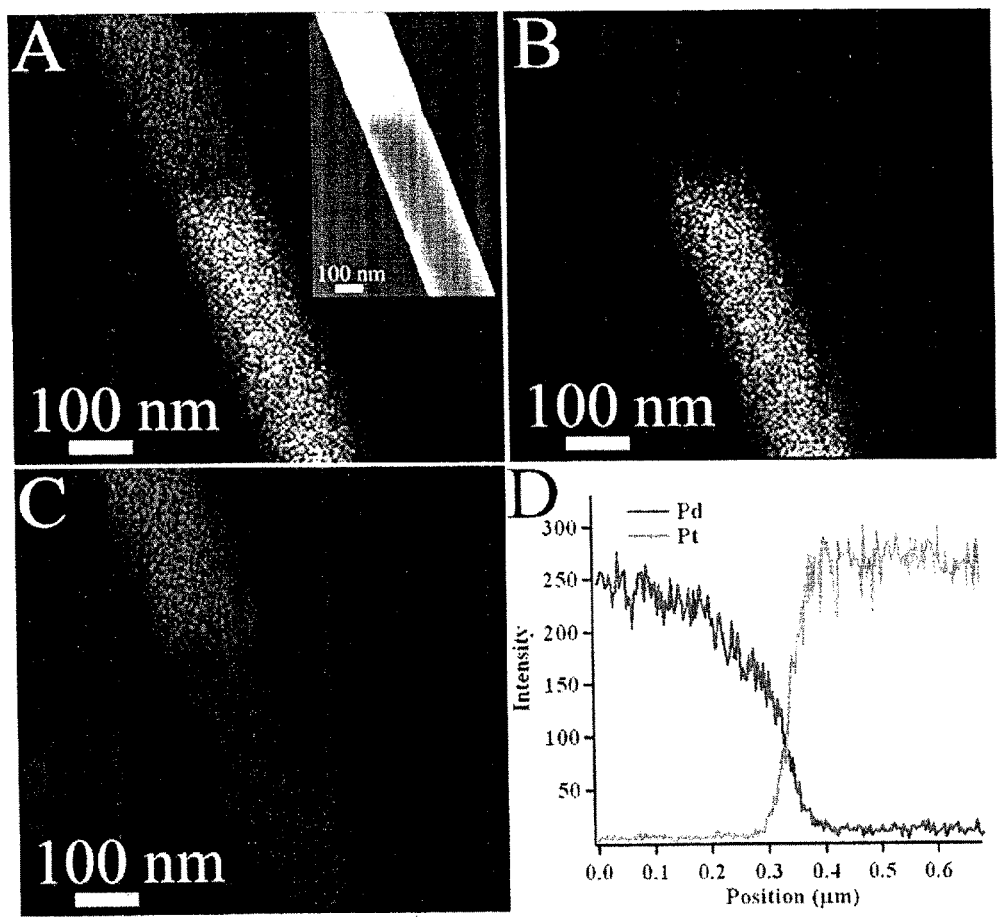
FIG. 5. EDAX map of the combined Pd and Pt-L edge signals (A) and HAADF (inset) are shown, corresponding to the interfacial region between the Pd and Pt segments of a representative Pd/Pt segmented NW. EDAX maps separately highlighting the Pt-L edge signal (B) and Pd-L signal (C) are also shown. The intensity of the Pd (darker line) and Pt (lighter line) EDAX signals is plotted (D) as a function of spatial position across the interfacial region.

To examine the quality of the interface and purity of the elemental sub-units, an energy dispersive X-ray spectroscopy (EDAX) was employed in scanning TEM mode. A representative EDAX map obtained at the interface of the Pd and Pt sub-units in a 1/1 Pd/Pt NW reveals a dramatic and precipitous boundary between Pd and Pt (FIG. 5A). The individual Pt-L edge (FIG. 5B) and Pd-L edge (FIG. 5C) confirm that there is a minimal degree of alloying present beyond the interfacial region. A high angle annular dark field image (HAADF) image shown as an inset to FIG. 5A also reveals a sharp, well-defined compositional interface between the Pd and Pt segments, thereby further reinforcing the notion of the intrinsically high quality of the as-prepared NWs.

Figure 6:
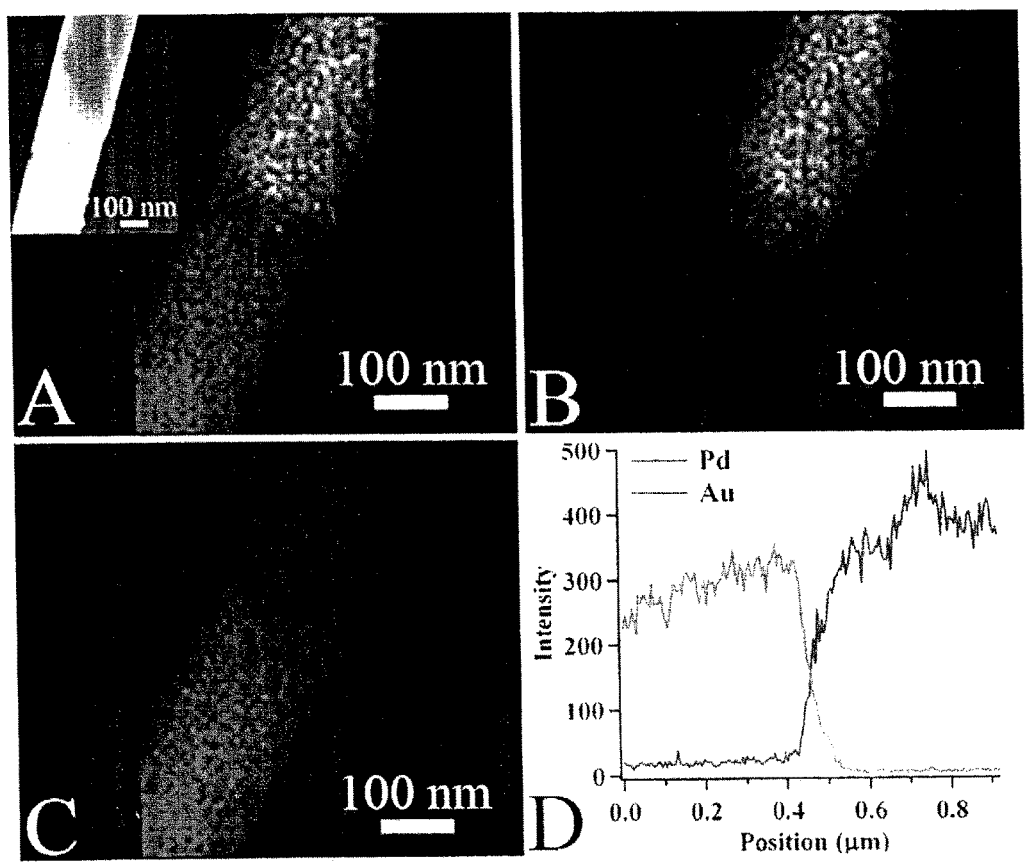
FIG. 6. EDAX map of the combined Pd and Au-L edge signals (A) and HAADF (inset) are shown of the interfacial region between the Pd and Au segments of a representative Pd/Au segmented NW. EDAX maps separately highlighting the Au-L edge signal (B) and Pd-L signal (C) are also shown. The intensity of the Pd (darker line) and Au (lighter line) EDAX signals is plotted (D) as a function of spatial position across the interfacial region.
Figure 7:
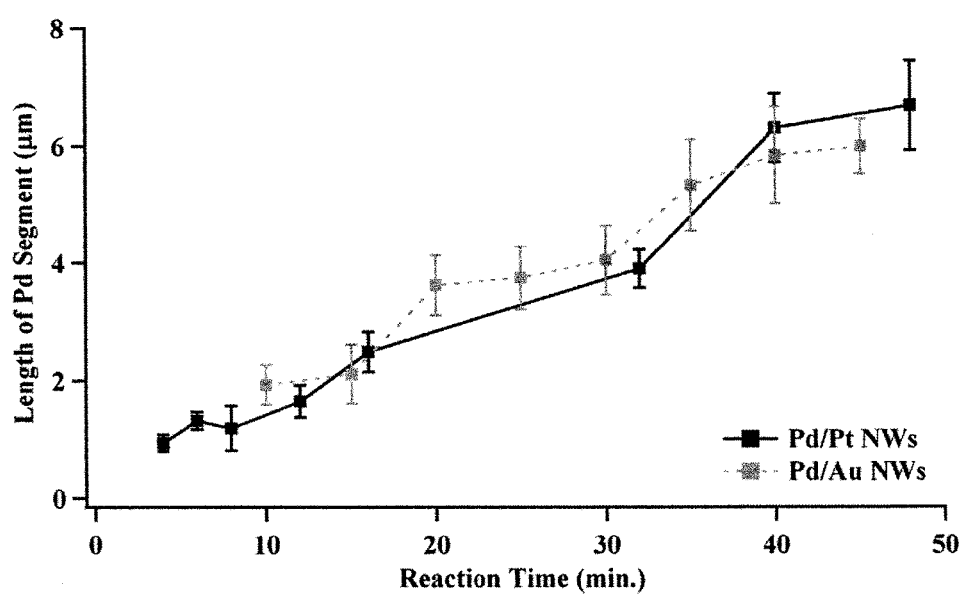
FIG. 7. The dependence of the measured length of the Pd segment as a function of the reaction time utilized in the first reaction step.

To complement the EDAX maps and HAADF images, an EDAX line scan centered about the interface (FIG. 5D) was obtained so as to provide more detailed spatial information into the transitional region between the Pd and Pt sub-units. It is apparent from the line scan that the interface region of the NW with Pd and Pt coexisting at appreciable levels spans a length of 75-100 nm, representing only about 2% of the entire NW's length. More importantly, nearly undetectable Pt and Pd signals exist beyond the interfacial region associated with the Pd and Pt sub-units, evincing that the degree of alloying is minimal. Similar data have been obtained in the characterization of the Pd—Au interface present on a representative 1/1 Pd/Au NW (FIG. 6), a finding which further highlights the versatility of the synthesis.

Applications of as-Prepared Segmented Nanowires as Effective Electrocatalysts and Nanomotors Given the high quality and purity of the as-prepared segmented NWs, their performance as electrocatalysts as well as nanomotors was examined for the potential for these NWs to be employed in practical multifunctional applications. First, examined was the electrocatalytic performance toward the oxygen reduction reaction of the Pd/Pt and Pd/Au NWs with lengths of 1/1, utilizing the thin-layer rotating disk electrode method. Cyclic voltammograms (CVs) collected from the Pd/Pt, Pd/Au, and elemental Pd NWs clearly display the prominent features associated with hydrogen adsorption and desorption ($H_{ads}$) as well as with oxide formation in the 0.1-0.4 V and 0.5-1.0 V regions, respectively. The $H_{ads}$ regions in the cases of the Pd/Pt and Pd/Au NWs are distinctive from those of elemental Pd NWs alone and, in fact, are consistent with the mutual presence of either elemental Pd and Pt or Pd and Au active sites.

A more profound effect of the Pt and Au segments present in the Pd/Pt and Pd/Au NWs is apparent in the peaks associated with the surface oxide reduction region. In the case of the elemental Pd, the single sharp cathodic peak localized at 0.63 V is readily assigned to the reduction of oxide species adsorbed onto the active Pd surface sites. In the case of the Pd/Pt species, the sharp peak at 0.64 V is accompanied by a second peak localized at 0.73 V, which can be readily assigned to the reduction of oxide species adsorbed onto the more noble Pt active sites. Interestingly, the Pd/Au CV maintain cathodic peaks at 1.13 V (broad) and 0.81 V in addition to the Pd oxide reduction peak, located at 0.65 V. In this case, the broad cathodic peak at 1.13 V can be readily attributed to the reduction of weakly adsorbed oxide species on elemental Au active sites. On the other hand, the sharp cathodic peak at 0.81 V is consistent with the reduction of oxide species from Pd—Au pair sites and can be readily attributed not only to the pair sites present in the Pd—Au interfacial region but also from the minor quantity of Pd present in the Au segment.

To further characterize the nature of the Pd, Pt, and Au active sites present on the segmented NWs, CO was utilized as a probe molecule to examine their availability and role in determining the performance of the NWs toward CO stripping. The CO stripping voltammograms for the Pd/Pt, Pd/Au, and elemental Pd NWs were examined. The Pd NWs display a single sharp anodic peak at 0.925 V, consistent with CO stripping from the homogeneous Pd active sites present at the surface of the elemental NW. Utilizing this as a reference for CO oxidation on elemental Pd sites, the Pd/Pt and Pd/Au NWs possess similar peaks at 0.863 V and 0.890 V, which are consistent with the stripping of CO from the Pd active sites present in the Pd sub-unit of these systems. The combined effects of the bimetallic pair sites at the interface and the inherent electronic interactions between the segments previously observed in these systems likely explain the significantly weakened interaction with CO.

Interestingly, the Pt/Pd NWs preserve a second CO stripping peak located at 0.775 V and this peak can be readily assigned to Pt active sites that are present on the Pt sub-unit. The measured potential of 0.775 V in the case of the Pt/Pd NWs is significantly lower than the corresponding value obtained from commercial carbon supported Pt nanoparticles (0.820 V), further indicating that the segmented structures sustain uniquely weakened interactions with CO.

In the broader sense, the CV and CO stripping data obtained from the Pd/Pt, Pd/Au and Pd NWs collectively confirm that the as-prepared segmented Pd/Pt and Pd/Au nanostructures possess Pd, Pt, and Au active sites with electrochemical behavior consistent with that of their elemental counterparts. Furthermore, these results clearly demonstrate that the segmented NW architecture allows for the mutual presence of two types of distinctive active sites to be present on the same NW simultaneously. This observed catalytic multi-functionality is uncommon, and can render a single nanostructure capable of catalyzing more than one electrochemical reaction with tunable, targeted specificity.

The inherent performance of these nanostructures toward the electrocatalytic reduction of oxygen in acidic media was examined. Polarization curves obtained from the Pd/Pt and Pd/Au NWs in oxygen saturated 0.1 M $HClO_4$ electrolyte highlight the enhanced performance of the Pd/Pt NWs, which is consistent with the presence of Pt active sites. To examine the intrinsic activity of the segmented NWs, the kinetic currents ($I_K$) measured at 0.9 V were normalized to the electrochemically available surface area (ESA) in order to calculate the area-normalized kinetic current density ($J_K$) or so-called specific activity. On the basis of this analysis, the measured specific activities obtained from the Pd/Pt and Pd/Au NWs were analyzed. Prior characterization of Pd and Pt NWs revealed that the analogous elemental systems maintained activities of 0.20 $mA/cm^2$ and 0.82 $mA/cm^2$, respectively. The as-prepared Pd/Pt NWs possess an "averaged" activity of 0.49 $mA/cm^2$, which is in excellent agreement with the value calculated (0.51 $mA/cm^2$) from imparting equal contributions of the activities from the elemental Pd and Pt active sites.

In the case of the Pd/Au NWs, the elemental gold active sites do not undergo hydrogen adsorption and maintain nearly undetectable levels of oxygen reduction in acidic media. Since the gold segment is essentially electrochemically inert under these conditions, the measured specific activity of the Pd/Au NWs is solely related to the nature of the Pd active sites present on the Pd sub-unit. The measured specific activity (0.27 $mA/cm^2$) of the Pd active sites agrees very well with the corresponding value obtained from analogous active sites on elemental Pd NWs (0.20 $mA/cm^2$). The slight but measurable enhancement in the performance of the Pd active sites in this case may arise from the presence of Pd—Au bimetallic sites present at the interface as well as from advantageous electronic effects, which are well characterized in Pd—Au systems. Collectively, the electrocatalytic performance of all of these nanostructures confirms that Pd, Pt, and Au active sites are not only present but also retain a catalytic performance potential, analogous to, or even enhanced, as compared with their bulk elemental counterparts.

In addition to demonstrating their outstanding electrochemical and catalytic properties, as-prepared Pd/Pt and Pd/Au segmented NWs was examined as catalytic nanomotors. The locomotion of segmented NWs was probed as a function of $H_2O_2$ concentration in aqueous media utilizing confocal microscopy. The velocities of the Pd/Au and Pd/Pt NWs dispersed into aqueous solution, containing $H_2O_2$ concentrations ranging from 0 to 9 M, were measured. It is apparent that the velocity of the Pd/Pt and Pd/Au NWs is significantly enhanced in the presence of $H_2O_2$ with concentrations as low as 0.1 M. Higher "fuel" concentrations drive the NWs faster. In fact, the Pd/Pt and Pd/Au NWs move at velocities of 4.1±1.8 µm/s and 3.1±0.9 µm/s in 9 M $H_2O_2$, which represents a four and three-fold increase, respectively, in velocity as compared with the corresponding values of 1.1±0.3 µm/s and 1.3±0.1 µm/s, respectively, obtained in pure water alone.

The locomotion phenomenon not only was composition-dependent but also was accompanied the evolution of oxygen gas from the solution, when $H_2O_2$ was present. These results collectively suggested that the increased locomotion observed was a result of a self-electrophoresis process induced by the catalytic decomposition of $H_2O_2$. In addition, it is also apparent that the velocity of the as-prepared NWs can be predictably tuned from about 1 µm/s to as high as 4 µm/s by manipulating the concentration of $H_2O_2$ present in the solution, a finding in qualitative agreement with data obtained on Pt-coated $TiO_2$ systems.

A recent report demonstrated that Pd/Pt and Pd/Au NWs with lengths of about 2 µm can achieve velocities ranging from 13-15 µm/s (Wang et al., *Langmuir* 22:10451-10456 (2006)). The velocities determined in the present invention for longer NWs with lengths of up to 8 µm achieve maximum velocities of up to 4 µm/s. Recent insights into the mechanism of locomotion of these NWs have suggested that an increased NW length will likely result in measurably lower velocities as a consequence of the higher proportional mass of the nanostructure, the potential for increased sliding friction across the underlying substrate, and a correspondingly more noticeable fluid drag in solution. Therefore, the lower velocities measured are in agreement with the existing literature on the mechanism of segmented NW locomotion in the presence of $H_2O_2$.

The actual pathway of the NW movement also provides additional insights into the chemotaxis of segmented NWs in $H_2O_2$ solution. The precise movement of representative Pd/Pt and Pd/Au NWs in 9 M $H_2O_2$ and pure water, respectively, as a function of position, was plotted. Utilizing the initial position of the NW as a reference point, it was apparent that the motion of the NWs in pure water is essentially random and that the overall pathway is limited to a small radius (about 5 µm) centered about the starting origin position. These results suggest that NW motion in pure water is largely a result of Brownian motion. By contrast, it is clearly apparent that the NWs move in a far more directed pathway, that extends much further from the initial position, when immersed in 9 M $H_2O_2$. Careful inspection of the motion of the NWs also reveals that the NWs maintain directed motion in $H_2O_2$ with the orientation of the NW itself remaining fixed with respect to the forward moving direction. This high degree of directionality describing the motion of the segmented NWs in the presence of $H_2O_2$ further highlights that the underlying rationale for the observed spatial evolution of these NWs is a direct consequence of the catalytic decomposition of $H_2O_2$ by the two distinctive sub-units of the bimetallic NWs.

Although there is a high degree of directionality to the motion in $H_2O_2$, the observed pathways are not necessarily linear, a fact which may arise from the slight curvature of the as-prepared Pd/Au and Pd/Pt NWs that is readily apparent in the SEM images. Recent studies of locomotion in segmented NWs with slightly curved 1D morphologies have shown that the curvature of the NW can influence both the hydrodynamic flow of water over the NW surface as well as the localized drag coefficient, thereby accounting for the somewhat erratic trajectories observed. Manipulations of the surface roughness of these as-prepared NWs can lead to the formation of more morphologically perfected 1D morphologies and hence, more predictable (i.e. through control of parameters such as directionality and rotational speed) and faster swimming patterns in solution in the presence of hydrogen peroxide. The observation of locomotion of the as-prepared Pd/Au and Pd/Pt NWs confirms that the efficient and "green" synthetic method of the present invention produces high-quality segmented structures with direct applicability as viable nanomotors.

Experimental Section

Synthesis of Bimetallic NWs

The individual segments of the Pd/Pt or Pd/Au NWs were synthesized in a two-step process involving the deposition of an initial metallic Pd NW segment followed by the subsequent deposition of a second Pt or Au gold layer.

Synthesis of the Pd segment

The synthesis of the Pd NW segment has been accomplished by the template-based method found in Koenigsmanns et al., ACS Nano 5:7471-7487 (2011), which is incorporated herein by reference. Briefly, Pd precursor and reducing agent solutions consisting of 50 mM sodium hexachloropalladate hydrate ($Na_2PdCl_6 \cdot xH_2O$, 99.9%, Alfa Aesar) and 5 mM sodium borohydride ($NaBH_4$, 98%, Acros), respectively. Immediately prior to synthesis, the internal one-dimensional pores of a 200 nm polycarbonate (PC) membrane (Whatman, Nucleopore track-etched) were saturated by briefly sonicating the membrane in ethanol. After sonication, the PC membrane, serving as a template for the growth of the NWs, was placed between the two glass half-cells of the U-tube double diffusion device. The reaction was initiated by simultaneously adding the precursor and reducing agent solutions into the two respective half cells. The reduction of Pd could be visually confirmed by formation of metallic material on the external surface of the template, exposed to the reducing agent half-cell. Utilizing this observation as a reference point, the reaction of the Pd segment was allowed to proceed with times varying from 10 to 60 min, producing Pd NW segments with corresponding lengths ranging from 1 to 6 µm, respectively.

Synthesis of the PdM (M=Pt or Au) Segment

Following the synthesis of the as-prepared Pd NW segment, a second metallic segment was grown from the existing Pd NW segment, utilizing a second electroless deposition process. Specifically, once the desired reaction time and corresponding Pd NW length was achieved in the first reduction step, the Pd precursor and reducing agent solutions were removed from the respective half cells, thereby effectively quenching the growth of the Pd NW segment. Subsequently, aliquots of ethanol were added into the half-cells, so as to remove residual traces of precursors and reducing agent from the template pores for a duration of 5 minutes. After removal of the ethanol wash, the precursor half-cell was loaded with either a 50 mM tetrachloroauric acid ($HAuCl_4 \cdot xH_2O$, 99.999%, Alfa Aesar) solution in ethanol in the case of Pd/Au NWs or a 100 mM hexachloroplatinic acid ($H_2PtCl_6$, 99.9%, Alfa Aesar) solution in ethanol in the case of Pd/Pt NWs. The reducing agent half-cell was simultaneously filled to capacity with a 200 mM $NaBH_4$ reducing agent solution. Completion of the reaction was signaled by the formation of a thin layer of metallic material on the outer surface of the template, adjacent to and exposed to the precursor half-cell.

Isolation of the NWs

To remove the thin metallic layers on external surfaces of the resulting template, gentle polishing was applied on a Hard Arkansas Whetstone (Best Sharpening Stones Inc., 600-800 grit) until all of the excess metallic material was removed. Subsequently, the PC templates with the bimetallic NWs were immersed in dichloromethane (DCM, 99.5%, Acros Organics) for 10 minutes to remove the residual PC. Individual NWs were isolated from the DCM/PC solution by centrifugation at 3000-4000 rpm for 10 minutes. The NWs were purified of residual PC by repeating the immersion and isolation steps for an additional three cycles. A final product was obtained by dispersing the isolated NWs into absolute ethanol for additional characterization. For electrochemical measurements, as-prepared Pd/Au and Pd/Pt NWs were rendered into catalyst inks by dispersing the individual NWs into solutions of 25% isopropyl alcohol (IPA) in water with a concentration of about 2 mg/mL.

Structural Characterization

X-Ray diffraction (XRD)

Powder XRD samples were prepared by dispersing the NW samples into ethanol and drop casting the resulting slurry onto a glass microscope slide. Powder diffractograms of the as-prepared bimetallic NWs were obtained on a Scintag diffractometer, operating in the Bragg-Brentano configuration with $Cu_{K\alpha}$ radiation ($\lambda=1.54$ Å). Diffraction patterns were collected from 35° to 95° at a scanning rate of 0.2° in 2θ per minute.

Electron Microscopy

The size, morphology, and chemical composition of the resulting bimetallic NWs were initially characterized via a field emission SEM along with energy dispersive X-ray analysis. Images and spectra were taken on a Leo 1550 SEM instrument at accelerating voltages of 20 kV. Samples were dispersed into ethanol and drop cast onto clean Si wafers subsequently mounted onto the surfaces of an Al holder via conductive carbon tape.

High resolution transmission electron microscopy (HRTEM), high angle annular dark field images (HAADF), energy dispersive X-ray data in scanning TEM mode (TEM-EDAX), and selected area electron diffraction (SAED) patterns were acquired on a JEOL 2100F instrument equipped with a Gatan HAADF detector for performing incoherent HAADF/Z-contrast imaging in scanning TEM mode at accelerating voltages of 200 kV with a beam size of 2 Å.

Electrochemical Characterization

Prior to electrochemical experiments, a glassy carbon rotating disk electrode (GC-RDE, Pine instruments, 5 mm) was polished until a pristine finish was obtained. The pristine GC-RDE was pre-modified with a thin carbon layer by rapidly drying two 5 µL drops of a 1 mg/mL solution of Vulcan XC-72R carbon dispersed in 25% IPA to improve the dispersion and stability of the NW catalysts. Once modified, the GC-RDE was loaded with a single 5 µL drop of the appropriate catalyst ink, which was allowed to evaporate in air. Once dry, the various catalyst layers were sealed with a 5 µL drop of a 0.025% Nafion solution prepared by diluting a 5% stock solution (Aldrich) in ethanol. Electrochemical measurements were performed in a 0.1 M perchloric acid solution ($HClO_4$), prepared by diluting the acid concentrate (Fisher Scientific, Optima Grade) with high purity water (R=18.2 MΩ). Platinum foil and an Ag/AgCl (3M Cl$^-$) electrode isolated in a double junction chamber (BaSi) served as the counter electrode and reference electrode, respectively. All of the potentials herein have been reported with respect to the reversible hydrogen electrode (RHE), unless otherwise specified.

The measurement of the ORR performance of the various catalyst samples was performed by employing the thin-layer rotating disk electrode method (Garsany et al., *Anal. Chem.* 82:6321-6328 (2010)). First, CVs were obtained in deoxygenated electrolyte at a scan rate of 20 mV/s to establish the electrochemically accessible surface area (ESA). The ESA is calculated in this case by converting the average of the hydrogen adsorption and desorption charge (after correcting for the double layer) into a real surface area utilizing the 0.21 $\mu C/cm^2$ as a known conversion factor. In the case of as-prepared NWs, it is important to note that both adsorption and absorption of hydrogen contribute to the measured charge. Therefore, the calculated specific activities herein represent a lower limit of the potential activity derived from these nano structures.

Furthermore, in the case of the Pd/Au NWs, the gold atoms do not undergo hydrogen adsorption and desorption, and thus, the reported ESA is actually related to the presence of Pd active sites, as opposed to the entire NW surface. The ORR activity of the various catalyst samples is measured by obtaining polarization curves in oxygen-saturated electrolytes at 20° C. with the electrode rotating at a rate of 1600 rpm and the potential scanned at a rate of 10 mV/s.

Application of Segmented NWs as Nanomotors.

The precise behavior of the bimetallic NW locomotion was visualized and video recorded using a Zeiss LSM 510 META NLO Two-Photon Confocal Microscope at 1000× magnification. The NW samples were well dispersed in water, and the top part of the suspension was loaded on to a ½ inch glass bottom culture dish (MatTek). A corresponding amount of $H_2O_2$ solution (30%, Reagent Grade, BDH) was added to and mixed with the NW suspension so as to generate $H_2O_2$ concentrations ranging from 0.1 to 9 M. The trajectories of at least 10 individual NWs from each suspension solution were video-recorded with a CCD camera under visible light for 20 seconds each at a rate of 4 images per second with a resolution of 1388×1040 pixels. The X and Y coordinates of the individual NWs were tracked on each frame over a 20 second time period, utilizing the ImageJ software package with the LSM Reader plug-in (National Institute of Health). From this data, the distance traveled as well as velocity information associated with each NW were calculated.

Bimetallic Alloyed Nanostructures

Utilizing the methods of the present invention, a series of bimetallic $Pd_{1-x}Au_x$ and $Pd_{1-x}Pt_x$ nanowires (NWs) with a variety of chemical compositions (x=0.1, 0.25, 0.5, 0.75 and 0.9) and with control over surface texture and size were prepared. In addition, it was demonstrated that these template-based NWs display significant improvements in electrocatalytic activity and durability toward oxygen reduction.

X-ray powder diffraction (XRD) obtained on the $Pd_{1-x}Au_x$ and $Pd_{1-x}Pt_x$ NWs confirms that the NWs are homogeneous alloys with the desired face-centered cubic crystal structure. Vegard's law was employed to estimate the chemical composition of the NWs on the basis of the calculated lattice parameters. The composition of the $Pd_{1-x}Au_x$ nanostructures correlates with that of the corresponding precursor solution employed during each synthesis, which is in excellent agreement with prior results. Composition measurements were also obtained on NW collections by scanning electron microscopy and energy dispersive X-ray analysis (SEM-EDAX). The observed trend is in agreement with that of XRD results. In the case of $Pd_{1-x}Pt_x$, the incorporation of Pd is favored slightly in as-prepared NWs, which may potentially arise from faster diffusion of the Pd precursor into the pore space. The corresponding SEM images obtained on the various $Pd_{1-x}Au_x$ and $Pd_{1-x}Pt_x$ NWs highlight the uniformity and homogeneity of the samples. There is no significant difference in diameter, aspect ratio, or surface texture as a function of NW composition. Overall, as-prepared $Pd_{1-x}Au_x$ and $Pd_{1-x}Pt_x$ NWs maintain collective diameters of 50±9 and 49±8 nm, respectively, with lengths of up to 6 μm, consistent with the dimensions of the template pores.

With the $Pd_9Au$ NWs serving as a representative example, as-prepared NWs can be isolated as either individual NWs or as oriented free-standing NW arrays, rendering these NWs as excellent candidates for sensing and electronics. Representative transmission electron microscopy (TEM) images of a single $Pd_9Au$ NW show that the NWs are dense and uniform with a distinctive texture and orientation. The surfaces are uniformly faceted and it is apparent that the facet sizes are inherently limited by the roughened uneven texture of the template's pore wall. Selected area electron diffraction (SAED) patterns obtained before and after a brief heat treatment revealed that after processing, the $Pd_9Au$ NWs are highly textured and largely single crystalline, with short polycrystalline segments restricted to the ends of the NW. The HRTEM image obtained along the central single crystalline segment indicates the presence of well-resolved equidistant lattice planes with a spacing of 0.230 nm. The diffraction data in combination with the HRTEM images suggest that the long axis of the NWs is oriented along the [111] crystallographic direction. Similar results are observed in the case of the $Pd_{1-x}Pt_x$ NWs. However, the diffraction data and associated HRTEM image reveal that these NWs are not actually single crystalline but rather are composed essentially of an aggregated ensemble of oriented crystallites.

In addition to characterizing the crystallinity as a function of position along the NW, EDAX was employed in scanning TEM mode to gain insight with respect to the uniformity of the NW's composition. FIG. 9A shows a high-angle annular dark field (HAADF) image of a portion of the $Pd_9Au$ NW. The contrast (sensitive to Z) is largely homogeneous, suggesting that the NWs maintain relatively uniform and consistent composition throughout their entirety. The few areas of lighter contrast result from the uneven texture of the NW surface as well as porosity within the NW itself. Representative EDAX maps of the $Pd_9Au$ and $Pd_3Pt_7$NWs shown in FIG. 9A and FIG. 11A reveal that the spatial distributions of the elements are uniform throughout the NW and that no segregation of the metals into discrete phases is apparent. These results are consistent with the XRD and HRTEM results. EDAX spectra shown in FIG. 9C were obtained at various points along the length of an individual isolated $Pd_9Au$ NW, corresponding to the locations shown in FIG. 9B. The chemical compositions at each point are shown in Table 1 and it is apparent that the distribution of Pd and Au is uniform along the length of the entire NW. In contrast, an analogous examination of the $Pd_3Pt_7$NWs summarized in FIGS. 11B-C and Table 2 reveals that the NWs may become slightly enriched with Pt as it elongates in the template pore.

High quality, anisotropic $Pd_9Au$ NWs were employed to explore the role of morphology in the performance of bimetallic Pd—Au nanostructures towards ORR. Data on the cathodic ORR kinetics of the $Pd_9Au$ and Pd NWs were obtained by the thin-layer rotating disk electrode method. Specifically, the cyclic voltammograms collected from $Pd_9Au$ and Pd NWs displayed the characteristic surface oxide formation (0.6-1.0 V) and hydrogen adsorption/desorption ($H_{ads}$, 0.1 to 0.4 V) regions. The oxide reduction peak of the $Pd_9Au$ NWs (0.7963 V) is significantly shifted by ~20 mV to higher potentials as compared with the Pd NWs (0.7729 V). This result suggests that the Pd$_9$Au NWs should maintain improved ORR performance as a result of the weaker interaction with the adsorbed oxygen species. Additionally, it is apparent that the smooth shape of the H$_{ads}$ region of the Pd$_9$Au NWs resembles that of the highly active Pt (111) surface.

On the basis of the polarization curves obtained in oxygen saturated 0.1 M HClO$_4$, the Pd$_9$Au NWs maintain significantly enhanced activity as compared with the Pd NWs alone. The measured kinetic currents at 0.9 V were normalized to the electrochemical surface area (ESA) to gain insight into the intrinsic activity of the Pd surface sites. The Pd$_9$Au NWs display an outstanding specific activity (J$_K$) of 0.49±0.04 mA/cm$^2$, which is more than double that of the Pd NWs alone (0.21±0.02 mA/cm$^2$). The activity of the Pd$_9$Au NWs also represents a two-fold improvement over the corresponding value measured for Pt NPs (0.21 mA/cm$^2$). In fact, it is also apparent from the potential versus kinetic current (E vs J$_K$) plot that the activity of the Pd active sites exceeds that of commercial Pt NP/C over the entire range of plausible operating potentials. This is a surprising and good result, since activities greater than that of commercial Pt NPs alone were achieved with essentially no discernible Pt loading. The observed superior performance of the Pd$_9$Au nanowires demonstrates the enhanced activity of PdAu bimetallic nanotubes, as compared with conventional catalysts, toward ethanol electroxidation.

In the existing literature regarding mixed Pd/Au electrocatalysts, the origin of enhanced ORR and alcohol electrooxidation performance has been attributed to the presence of bimetallic Pd—Au pair sites at the surface in some cases and in others, to the unique properties of the PdAu alloy phase. To explore the origin of enhancement in the alloyed NWs, Cu underpotential deposition (UPD) (Au$_{UPD}$~Pd NWs) and galvanic displacement (Au$_{GD}$~Pd NWs) reactions were utilized to deposit Au atoms at the surfaces of elemental Pd NWs. These methods were selected because they provide for two types of Pd—Au pair sites at the nanowire surface (e.g. gold clusters in the case of Cu UPD and a mixture of gold clusters and porous PdAu in the case of galvanic displacement). Because the Pd NWs and Pd$_9$Au NWs maintain similar dimensions, crystallinity, and surface texture, the role of the Au additive is highlighted. Analysis of these samples by CV reveals that the gold modified Pd NWs with Pd—Au pair sites at the surface maintain H$_{ads}$ and oxide formation features that are similar to that of the Pd NWs. There are only negligible enhancements in the specific ORR activity of the Pd active sites in these samples. Hence, these results suggest that the origin of enhancement in the Pd$_9$Au NWs is due to their homogeneous alloyed structure, as opposed to merely the presence of bimetallic sites localized on the NW surface. The combination of the advantageous 1D structural motif with the beneficial structural and electronic properties of PdAu alloys accounts for the enhanced performance in the case of ORR.

In addition, the Pd$_9$Au NWs were employed as a substrate for the deposition of a Pt monolayer shell (Pt~Pd$_9$Au NWs) prepared by Cu UPD/galvanic displacement. It is apparent from the CVs that a Pt monolayer shell has been deposited and that the Pt~Pd$_9$Au NWs maintain a favorable shift in the oxide reduction peak (0.8093 V) when compared with the Pt~Pd NWs (0.7975 V). The corresponding polarization curves as well as E vs J$_K$ curves confirm the high ORR activity of the Pt~Pd$_9$Au NWs when compared with the Pt~Pd NWs. As tangible evidence, specific and platinum mass activities at 0.9 V of the Pt~Pd$_9$Au NWs were determined to be 0.95±0.03 mA/cm$^2$ and 2.08±0.05 A/mg$_{Pt}$, respectively. The measured specific and platinum mass activity of the Pt~Pd$_9$Au NWs with the corresponding activities obtained from Pt~Pd NWs, Pt~Pd NPs, and commercial Pt NPs, respectively, were compared. It is apparent that a 2-fold enhancement is achieved over the activity of Pt~Pd NWs, highlighting the role of composition in the measured activity. The specific activity of the Pt~Pd$_9$Au NWs is also significantly enhanced as compared with the activity measured under membrane electrode assembly (MEA) conditions from analogous Pt~Pd$_9$Au NPs (i.e., 0.5 mA/cm$^2$), thereby highlighting the improvement in activity as a result of use of the 1D NW motif. In addition, the Pt~Pd$_9$Au NWs maintain a platinum group metal (PGM) activity of 0.16 A/mgp$_{GM}$, which is slightly enhanced with respect to the value typically obtained from commercial Pt NPs/C with the same total loading. Note that Pt, which is less abundant than Pd and Au, represents only 7.2% of the total mass of the Pt~Pd$_9$~Au NW sample.

The enhanced activity was accompanied by greatly improved stability and after 30,000 cycles of a durability test, the half wave potential of the polarization curve decreased by only 6 mV. The high stability is accompanied by a steady increase in the specific activity of the Pt~Pd$_9$Au NWs to 1.53 mA/cm$^2$, which is more than 1.5 fold higher than the original activity. To highlight the stability of the Pt~Pd$_9$Au NWs, TEM images obtained after 30,000 cycles reveal that there is essentially no perceptible change in the structural integrity and texture of the Pt~Pd$_9$Au NWs. In contrast, the analogous Pt~Pd NWs show an apparent evolution of a porous structure as a result of significant dissolution of the Pd core after only 20,000 cycles. Hence, the addition of 10% Au forming a stabilizing uniform alloy results in significant and measurable enhancements in both ORR performance and durability.

The cathodic ORR performance as a function of composition in the as-prepared Pd$_{1-x}$Pt$_x$ NWs was explored. The CVs highlight a transition in the structure of the H$_{ads}$ and oxide region to that of the elemental Pt NWs, as the proportion of Pt is increased in the as-prepared alloy NW samples. In fact, the specific activity measured at 0.9 V of the NWs increases from 0.64±0.01 mA/cm$^2$ to 0.79±0.01 mA/cm$^2$ as the Pt content correspondingly rises from 50 to 80%. This trend is further highlighted by the E vs J$_K$ curves. The activity of these bimetallic catalysts greatly surpasses the corresponding activity of both commercial Pt NPs (0.21 mA/cm$^2$) and elemental Pd NWs (0.20 mA/cm$^2$). However, an unexpected finding is that the activity of the PtPd NWs (0.64 mA/cm$^2$) also exceeds that of elemental Pt nanotubes with an outer diameter of 200 nm previously prepared and studied under identical conditions (Zhou et al., J. Phys. Chem. C 113(14):5460-5466 (2009), while only maintaining 50% of the Pt content.

In addition, the activity of the Pt$_9$Pd NWs (0.79 mA/cm$^2$) is essentially equivalent to the activity measured for analogous Pt NWs with approximately the same diameter (0.82±0.04 mA/cm$^2$). This fact is highlighted by the polarization curves, which indicate that the PtPd$_4$NWs maintain performance almost identical performance to that of the Pt NWs when the same quantity of metal is present on the electrode. In contrast, previous reports regarding alloyed PtPd nanoparticles have demonstrated that the activity of Pt$_{1-x}$Pd$_x$ (x=0.7-0.9) alloys exceeds that of pure Pt NPs as a result of a structural contraction induced by the incorporation of Pd atoms. In the case of NWs however, the enhanced activity of these systems has been generally attributed to a size-induced contraction of the nanowire surface, resulting in an advantageous change in the electronic properties of the nanowire. Hence, the observed activity trend for $Pd_{1-x}Pt_x$, NWs herein is more complicated and suggests that the size-induced contraction phenomenon may be dependent upon and influenced by not only their diameter but also their inherent chemical composition.

As-prepared $Pd_{1-x}Au_x$ and $Pd_{1-x}Pt_x$ nanowires display superior electrocatalytic performance as oxygen reduction catalysts as compared with commercial Pt nanoparticles alone, and more importantly, the correlation between composition and activity has been examined in these highly 1D anisotropic systems. The measured structure-property correlation highlights the unique advantages of our one-step synthetic approach because high quality 1D catalysts can be generated with predictable structure and composition in an efficient manner.

Materials & Methods:

1. U-tube Synthesis of $Pd_{1-x}M_x$ Nanowires

The synthesis of the $Pd_{1-x}Au_x$ and $Pd_{1-x}Pt_x$ nanowires was accomplished by utilizing a U-tube double diffusion device with a mixed precursor feed solution. Initially, precursor stock solutions of sodium hexachloropalladate (87.5 mg $Na_2PdCl_6.xH_2O$, 99.9%), hexachloroplatinic acid hydrate (102.5 mg $H_2PtCl_6.xH_2O$, 99.9%), and tetrachloroauric acid hydrate (64.0 mg $HAuCl_4.xH_2O$, 99.999%) were prepared by dissolving the powders obtained from Alfa Aesar into 5 mL of absolute ethanol. The concentrations of these solutions were optimized to achieve a high correlation between the precursor solution composition and the composition of the nanowires. To achieve the desired nanowire composition $(Pd_{1-x}M_x)$, a mixed precursor solution of identical chemical composition was produced by combining aliquots of the palladium stock solution and the metal stock solution, respectively, in the appropriate stoichiometric volume fraction so as to generate the total 5 mL volume. For example, a combined 5 mL precursor solution containing 3.75 mL of palladium stock solution and 1.25 mL of the gold stock solution was employed in the synthesis of the $Pd_3Au$ nanowires. Separately, a 5 mM sodium borohydride solution ($NaBH_4$, Alfa Aesar 98%) serving as the reducing agent solution was prepared by dissolving the solid powder into 5 mL absolute ethanol with the assistance of a brief period of sonication. Prior to performing the reaction, commercially available polycarbonate (PC) membranes (Whatman, Nucleopore track etched) with nominal pore sizes of 15 nm were sonicated in ethanol to pre-saturate the pores with solvent.

In a typical reaction, the PC membrane is clamped between the two half cells of the U-tube device and the half cells are separately loaded with the mixed precursor solution and the reducing agent solution, respectively. During the reaction, the precursor and reducing agent diffuse into the template pore space, which serves as a 1D reaction chamber spatially confining the nucleation and growth of the nanowire. The nucleation is initiated at the point where the diffusion fronts interact, resulting in the formation of a short polycrystalline segment. Subsequently, the nanowire is believed to elongate through the pore by an electroless deposition process, resulting in the formation of a metal nanowire with excess material on the surface of the membrane. The transition in crystallinity arises as a result of this two-step growth mechanism.

After 30 minutes of reaction time, the filled template is removed from the device and briefly rinsed with ethanol to remove residual traces of precursor and reducing agent. The filled templates can then be processed to generate either individual isolated nanowires or oriented free-standing arrays.

Individual isolated nanowires can be obtained by polishing off the excess metallic material on the membrane surface, dissolving the PC membrane in dichloromethane, and then separating by centrifugation. Additional purification can be achieved by repeating the washing and centrifugation steps, several times. Free standing nanowire arrays can be prepared by affixing the template onto a substrate (e.g. glass or Si) and exposing the wafer to oxygen plasma processing for a total of 20 mins in a reactive ion etcher (March Plasma). The reaction yield is highly dependent upon the pore diameter and pore density of the membrane that is employed and estimates of yield are typically between 0.05 and 0.1 $mg/cm^2_{template}$ for this method. Higher yields can be achieved by employing templates with higher pore densities such as anodic alumina.

2. Structural Characterization

Powder X-ray diffraction patterns were obtained on dry powders of the nanowires supported on glass with a Scintag diffractometer utilizing Cu K$\alpha$ radiation at a scan rate of 0.25° in 2$\theta$ per minute. Scanning electron microscopy (SEM) images were obtained using a Hitachi S4800 SEM instrument with an operating voltage of 5 kV. Accompanying energy dispersive X-ray data (EDAX) were collected on a Leo 1550 SEM with an operating voltage of 15 kV. Cross-sections of the template for imaging by transmission electron microscopy (TEM) were prepared by embedding the filled, as-prepared templates in Epon resin and 80 nm sections were cut with a Reichert-Jung UltracutE Ultramicrotome. Images of the cross-sections were obtained on a Technai12 BioTwinG$^2$ TEM instrument equipped with an AMT XR-60 CCD camera system. High resolution TEM (HRTEM), high angle annular dark field (HAADF) images, EDAX spectra in scanning TEM mode, and selected area electron diffraction (SAED) patterns were acquired on a JEOL 2010F instrument, equipped with a Gatan HAADF detector for performing either incoherent HAADF or Z-contrast imaging in scanning TEM mode at accelerating voltages of 200 kV. An in situ heat treatment was performed on the $Pd_9Au$ nanowires supported on the lacey carbon grid by raising the temperature to above 350° C., briefly. The evolution of the nanowires' crystalline structure was monitored at various temperatures by obtaining SAED patterns at various points along the length of the nanowire.

3. Electrochemical Characterization and Platinum Monolayer Deposition

Prior to electrochemical characterization, as-prepared isolated nanowires, commercial carbon supported Pt nanoparticles (Pt NP/C, 20% platinum loading, E-Tek), and Vulcan XC-72 carbon were rendered into catalyst inks by dispersing the dry powders into 25% isopropyl-alcohol in water so as to create an approximately 1 mg/mL solution. The precise composition was determined by performing thermogravimetric analysis (TGA) on a 10 µL aliquot of the catalyst ink with a TGA Q500 (TA Instruments). Before application of the nanowire ink, a polished pristine glassy carbon rotating disk electrode (GC-RDE, Pine Instruments, 5 mm) was modified by drying two 5 µL drops of the Vulcan XC-72 ink onto the electrode surface under vacuum to create a thin carbon layer. One 5 µL drop of the dispersed nanowire ink was then deposited onto the modified electrode and allowed to dry in air. Finally, the electrode was sealed with one 5 µL drop of an ethanolic 0.025% Nafion solution prepared from a 5% stock solution (Aldrich). The same procedure was employed for the Pt NPs/C. However, two drops of catalyst ink were dried onto an unmodified polished electrode. Electrochemical measurements were obtained in a 0.1 M perchloric acid solution (Fisher Scientific, Optima Grade), prepared in high purity water with a resistance of 18.2 MΩ. An Ag/AgCl (3 M cl⁻) combination isolated in a double junction chamber (Cypress) and platinum foil served as the reference electrode and counter electrode, respectively. All of the potentials herein have been reported with respect to the reversible hydrogen electrode (RHE), unless otherwise mentioned.

The deposition of a platinum monolayer was accomplished by a two-step procedure, first involving the deposition of a Cu monolayer by under potential deposition (UPD) followed by the galvanic displacement of the Cu ad-atoms with a platinum precursor. The details are described in Koenigsmann et al., *ACS Nano* 5(9):7471-7487 (2011); Koenigsmann et al., *Journal of the Amer. Chem. Soc.* 133 (25):9783-9795 (2011). In short, the Cu UPD was performed in a solution of 50 mM $CuSO_4$ dissolved in a 0.10 M $H_2SO_4$ supporting electrolyte. Once the deposition was complete, the Cu modified electrode is transferred to a solution of 1.0 mM $K_2PtCl_4$ dissolved in 50 mM $H_2SO_4$ under a high purity Ar atmosphere in a custom-built two-chamber housing.

4. Measurement of Oxygen Reduction Performance and Electrocatalyst Durability

The oxygen reduction performance of the various nanowire samples was determined using the thin layer rotating disk electrode method. First, cyclic voltammograms were obtained in Ar-saturated 0.1 M $HClO_4$ at a scan rate of 20 mV/s in order to establish the electrochemically addressable surface area (ESA). Specifically, the ESA was measured by the converting the average hydrogen absorption and desorption charge after double layer corrections into a surface area utilizing 0.21 μC/cm² as the known conversion factor. In the case of the Pd nanowires, absorption of hydrogen into the Pd lattice contributes to the measured $H_{ads}$ charge. Hence, the use of this measurement technique in the case of palladium-based nanowires may result in the measured surface areas representing an over-estimate of the true ESA. It is also important to note that surface gold atoms do not undergo $H_{UPD}$ and therefore do not contribute to the $H_{ads}$ charge. On this basis, the ESA of the $Pd_9Au$ nanowires is only related to the fraction of the surface sites occupied by Pd atoms (~90%). Thus, the measurement of the specific activity of these nanowires relates directly to the Pd active sites as opposed to the entire surface area of the nanowire.

$$\frac{1}{I_{0.9\ V}} = \left(\frac{1}{I_K} + \frac{1}{I_D}\right) \quad (1)$$

The activity of the nanowires toward oxygen reduction was measured by obtaining polarization curves in an oxygen-saturated 0.1 M $HClO_4$ electrolyte at 20° C. with the electrode rotating at a rate of 1600 rpm and at a scan rate of 10 mV/s.³ The measured kinetic current ($I_K$) can be calculated directly by utilizing the Koutecky-Levich relationship (Eqn. 1) where $I_{0.9\ V}$ and $I_D$ are the measured disk current at 0.9 V and the diffusion limited current at 0.4 V, respectively. The measured $I_K$ is then normalized to either the ESA, platinum mass, or platinum group metal mass of the catalyst loaded onto the RDE, respectively, in order to obtain surface area or mass normalized kinetic current ($J_K$) densities. The catalyst durability is tested by a protocol defined by the U.S. Department of Energy for simulating a catalyst lifetime under membrane electrode assembly conditions. The procedure though has been modified for use with a thin catalyst layer supported on an RDE under half-cell conditions. Specifically, the electrode is cycled from 0.6 to 1.0 V at 50 mV/s in a 0.1 M $HClO_4$ solution, left open to the air for up to 30,000 cycles. The ESA and specific activity are measured incrementally after every 5,000 cycles.

5. Preparation of $Au_{UPD}$~Pd NWs and $Au_{GD}$~Pd NWs

To explore the origin of enhancement in the $Pd_9Au$ nanowires, two additional samples were prepared wherein gold atoms were deposited at the surface to generate Pd—Au pair sites on elemental Pd NWs. First, the Cu UPD method we employed described in Section 3 to deposit gold clusters on the surface of Pd NWs, generating an $Au_{UPD}$~Pd NW. Specifically, a 1/10 Cu submonolayer was deposited by sweeping the potential until ¹⁄₁₀ of the total Cu UPD charge was obtained. While being held at the proscribed potential, the Cu-modified electrode was transferred under an Ar atmosphere to a solution of 0.1 mM $HAuCl_4$ dissolved in 5 mM $H_2SO_4$ and immersed for 15 s. Thereafter, the electrode is rapidly placed in ultrapure water to quench the reaction and minimize the displacement of surface Pd atoms. The coverage of gold deposited by this method was determined to be 17% by the decrease in ESA after the deposition step. The higher than expected coverage (e.g. >10% coverage) suggests that the gold precursor reacted with both the Cu ad-atoms and surface Pd sites, despite the rapid quenching. In a separate process, the surface of Pd NWs was modified by a controlled galvanic displacement of the surface Pd atoms with Au to create a mixture of Au clusters and porous Pd—Au at the surface ($Au_{GD}$~Pd NWs). Specifically, the Pd NWs supported on a GC-RDE were immersed in a solution of 0.1 mM $HAuCl_4$ dissolved in 5 mM $H_2SO_4$ under a Ar-filled atmosphere for 15 s followed by immediate immersion in ultrapure water to quench the displacement process. The degree of coverage was monitored by the change in ESA after each exposure to the gold precursor solution and after two exposures, the total coverage was found to be 12%.

TABLE 1

Figure 9:
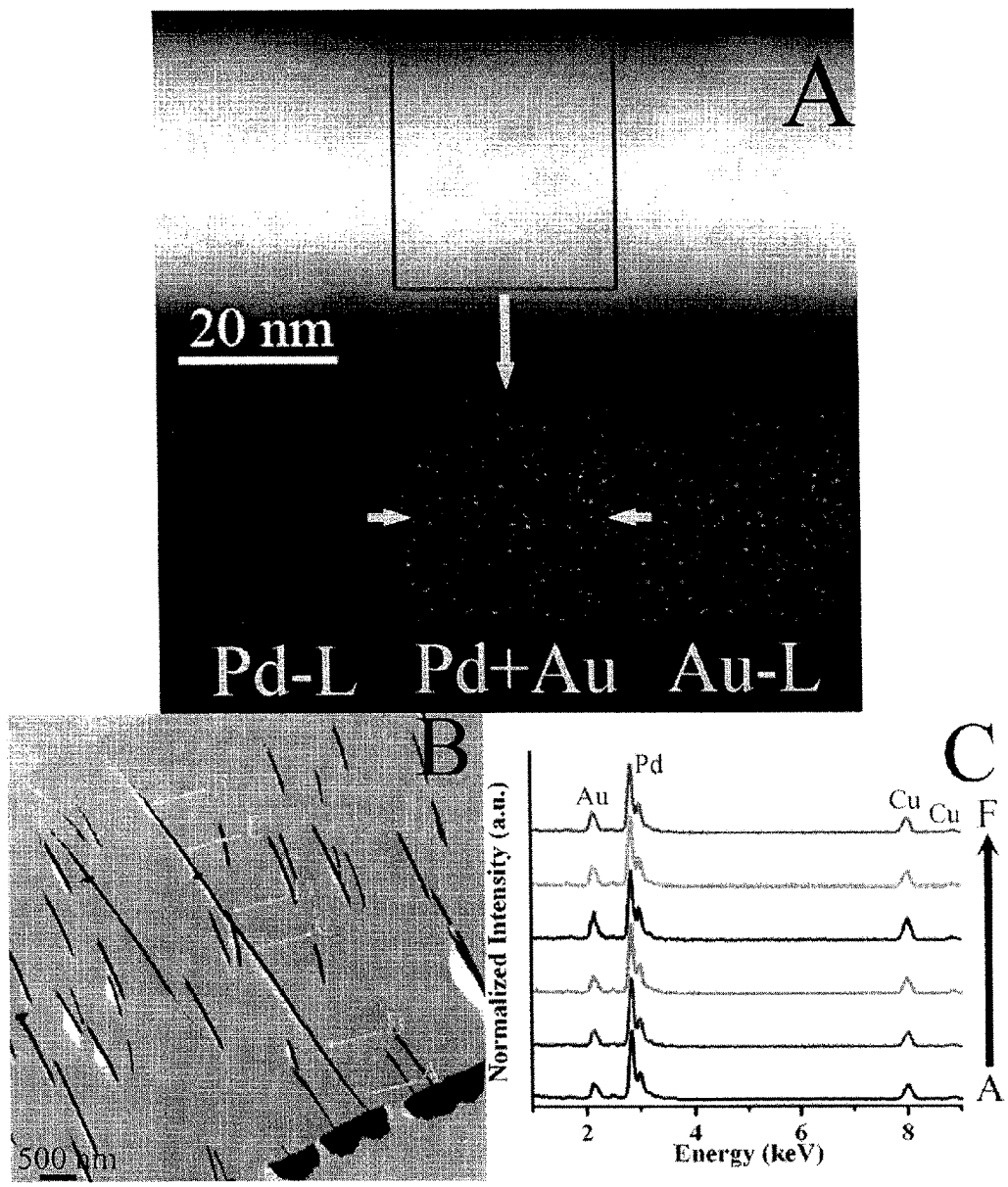
FIG. 9. Representative HAADF image of the Pd9Au NWs (A). Immediately below the TEM image, the EDAX maps obtained from the area denoted by the red box of the Pd and Au L-edge are shown on the left and right, respectively, with the combined map shown in the center. A TEM image (B) of a representative cross-section of an as-prepared template membrane containing Pd9Au NWs. EDAX spectra (C) obtained on an individual isolated NW at various points (A)-(F) along the wire are shown, corresponding approximately to those areas spatially highlighted in the TEM image.
Figures 10A, 10B:
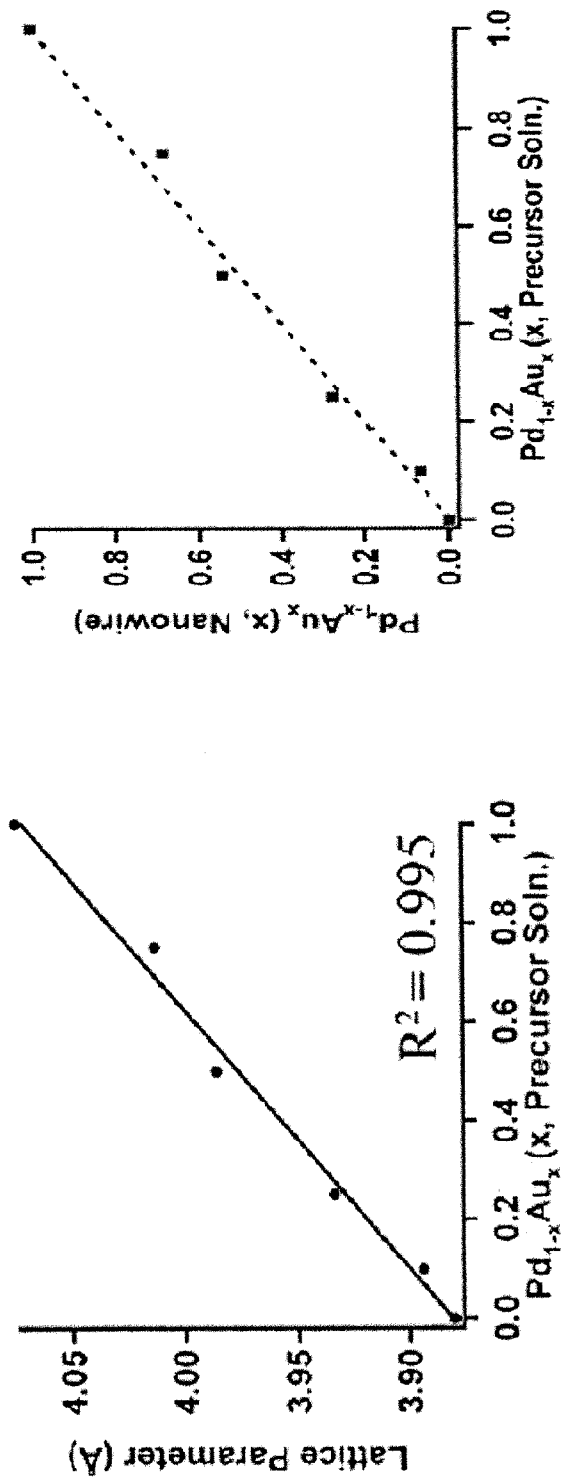
FIG. 10A. Graph depicting the lattice parameter as a function of the chemical composition of the precursor solution employed during the synthesis for the $Pd_{1-x}Au_x$ (A) nanowire series. The solid black line represents the linear regression of the data points with the associated $R_2$ value shown.
FIG. 10B. Graph depicting the trend in nanowire composition as a function of the chemical composition of the precursor solution employed during the synthesis for the $Pd_{1-x}Au_x$ nanowire series. XRD data are shown. The dashed line represents the ideal 1:1 correlation between the chemical composition of the precursor solution and the resulting nanowires over the entire composition regime.
Figure 10D:
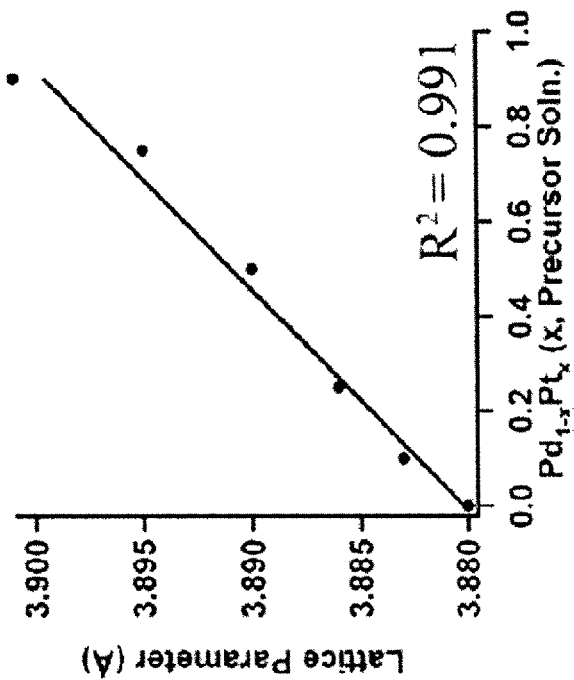
FIG. 10D. Graph depicting the lattice parameter as a function of the chemical composition of the precursor solution employed during the synthesis for the $Pd_{1-x}Pt_x$ nanowire series. The solid black line represents the linear regression of the data points with the associated $R_2$ value shown.
Figure 10C:
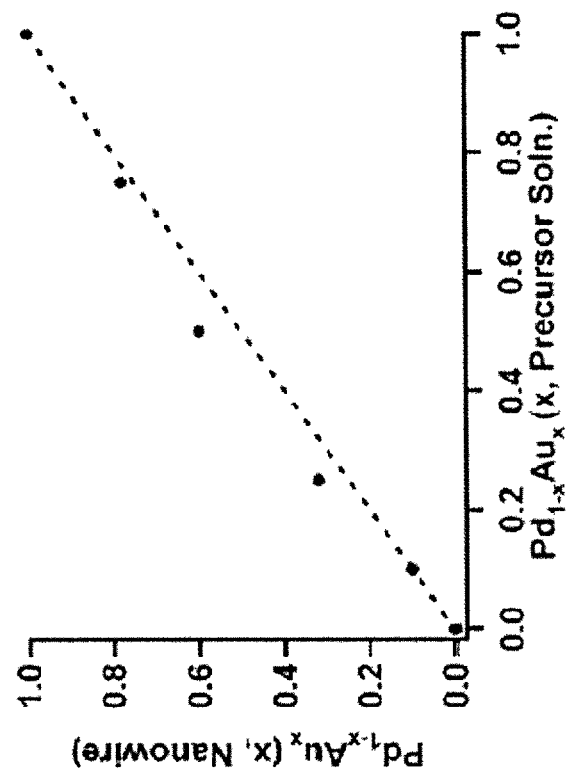
FIG. 10C. Graph depicting the trend in nanowire composition as a function of the chemical composition of the precursor solution employed during the synthesis for the $Pd_{1-x}Au_x$ nanowire series. EDAX data are shown. The dashed line represents the ideal 1:1 correlation between the chemical composition of the precursor solution and the resulting nanowires over the entire composition regime.
Figure 10E:
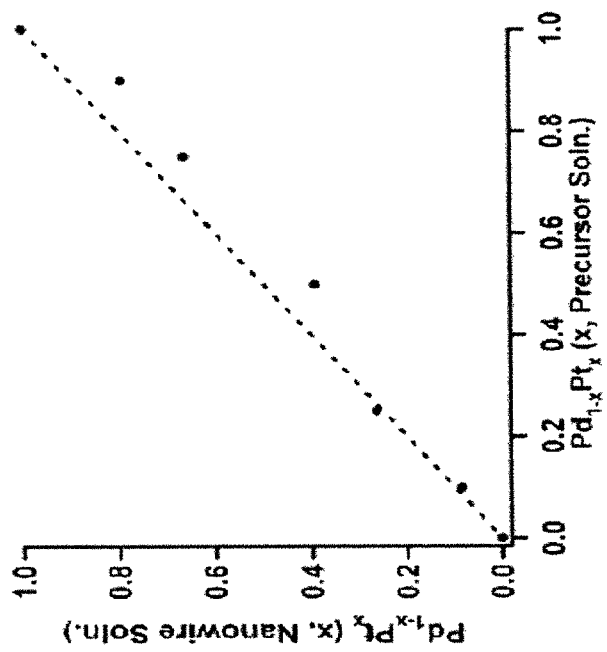
FIG. 10E. Graph depicting the trend in nanowire composition as a function of the chemical composition of the precursor solution employed during the synthesis for the $Pd_{1-x}Pt_x$ nanowire series. XRD data are shown. The dashed line represents the ideal 1:1 correlation between the chemical composition of the precursor solution and the resulting nanowires over the entire composition regime.
Figure 10F:
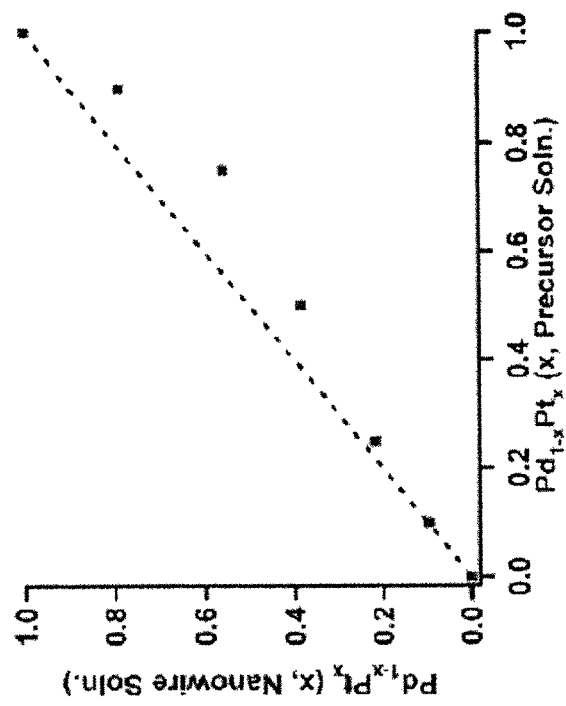
FIG. 10F. Graph depicting the trend in nanowire composition as a function of the chemical composition of the precursor solution employed during the synthesis for the $Pd_{1-x}Pt_x$ nanowire series. EDAX data are shown. The dashed line represents the ideal 1:1 correlation between the chemical composition of the precursor solution and the resulting nanowires over the entire composition regime.

The chemical composition (%, Atomic) of a representative $Pd_9Au$ nanowire obtained from TEM-EDAX spectra at various points along the nanowire, designated by the letters A-F in FIG. 9.

| Nanowire Position | % Pd | % Au |
|---|---|---|
| A | 91% | 9% |
| B | 91% | 9% |
| C | 91% | 9% |
| D | 88% | 12% |
| E | 90% | 10% |
| F | 90% | 10% |

TABLE 2

Figure 11:
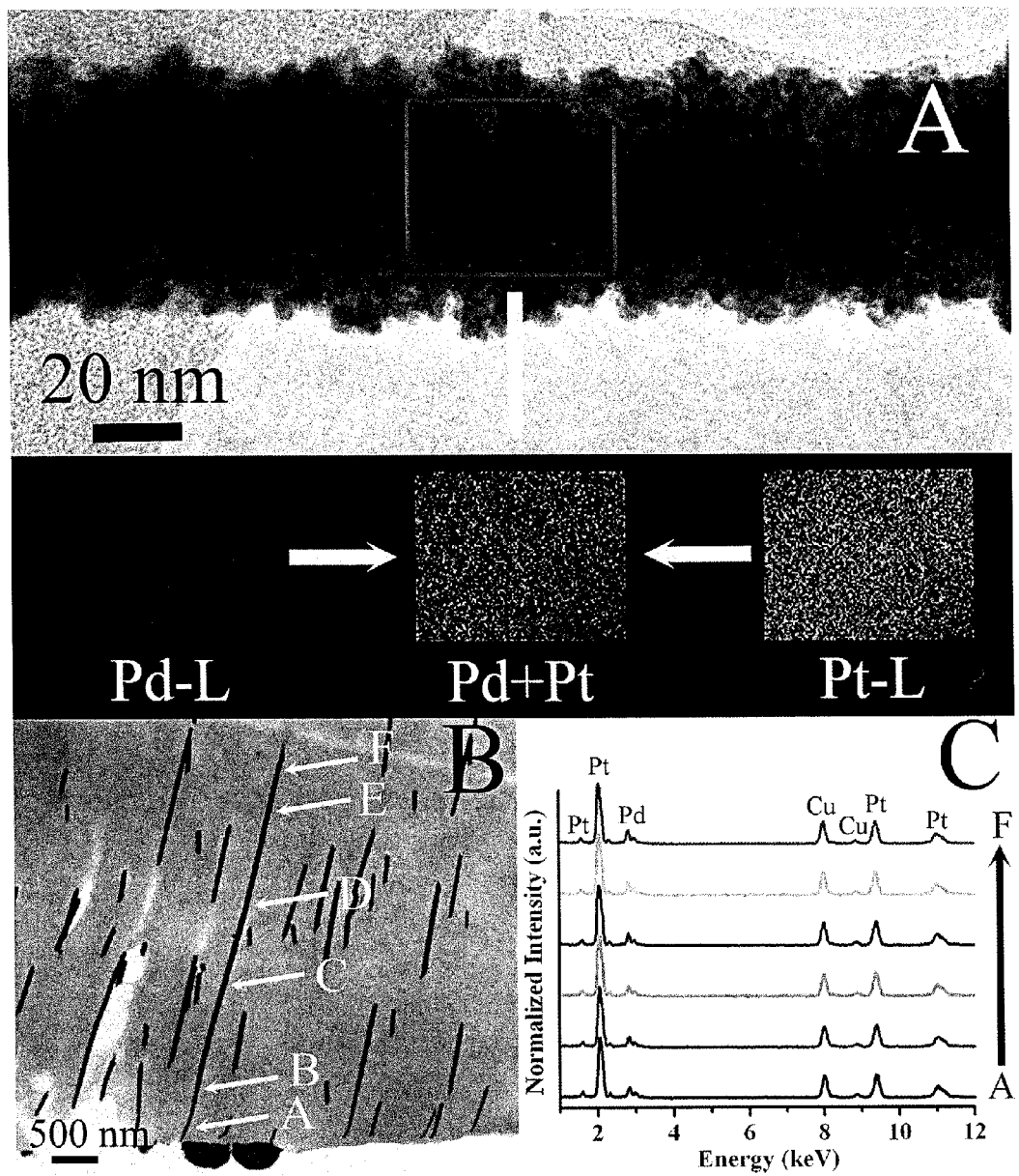
FIG. 11. A TEM image showing the central segment of an individual isolated $Pt_3Pd_7$NW (A). Immediately below the TEM image, the EDAX maps obtained from the area denoted by the red box of the Pd and Pt L-edge intensity are shown on the left and right, respectively with the combined map shown in the center. A TEM image (B) of a representative cross-section of an as prepared template containing $Pt_3Pd_7$ nanowires. EDAX spectra (C) obtained on an individual isolated nanowire at various points (A-F) along the wire are shown, corresponding approximately to those locations, highlighted in the TEM image.

The chemical composition (%, Atomic) of a representative $Pd_3Pt_7$ nanowire obtained from TEM-EDAX spectra at various points along the nanowire, designated by letters A-F in FIG. 11.

| Nanowire Position | % Pd | % Pt |
|---|---|---|
| A | 28% | 72% |
| B | 28% | 72% |
| C | 27% | 73% |
| D | 29% | 71% |
| E | 33% | 67% |
| F | 34% | 66% |

The invention claimed is:

1. A method of producing a segmented 1D nanostructure, the method comprising:
   providing a vessel containing a template wherein on one side of the template is a first metal reagent solution and on the other side of the template is a reducing agent solution, wherein the template comprises at least one pore;

allowing a first segment of a 1D nanostructure to grow within a pore of the template until a desired length is reached;

replacing the first metal reagent solution with a second metal reagent solution;

allowing a second segment of a 1D nanostructure to grow from the first segment until a desired length is reached, wherein a segmented 1D nanostructure is produced.

2. The method according to claim 1 further comprising growing at least one additional segment from the 1D nanostructure.

3. The method of claim 1 wherein the length of a segment is increased by increasing the growth time.

4. The method of claim 1 wherein before allowing the second segment to grow, the concentration of the reducing agent is increased by about two fold to about fifty fold.

5. The method of claim 4 wherein region of alloying on the nanostructure is less than about 100 nm.

6. The method of claim 1 wherein nucleation of the first segment of the nanostructure occurs at an interface of a pore of the template and the reducing agent solution.

7. The method of claim 1 wherein the metals of the first metal reagent solution and the second metal reagent solution are different from one another and wherein the metals are selected from the group consisting of transition metals, actinide metal and lanthanide metals.

8. The method of claim 7 wherein the metals are selected from the group consisting of Ru, Rh, Pd, Ag, Os, Ir, Pt and Au.

9. The method of claim 1 wherein the reducing agent of the reducing agent solution comprises at least one of metal borohydrides, sodium cyanoborohydride, citric acid, citrate anion, ascorbic acid, ascorbate anion, formic acid, formate anion, oxalic acid, oxalate anion, lithium aluminum hydride, diborane, alpine borane, hydrogen gas, hydrazine, and 2-mercaptoethanol.

10. The method of claim 1, wherein the 1D nanostructure is a nanowire, a nanotube, or an array comprising a plurality of nanowires.

* * * * *